(12) United States Patent
Terada et al.

(10) Patent No.: US 7,233,387 B2
(45) Date of Patent: Jun. 19, 2007

(54) IMAGE FORMING APPARATUS

(75) Inventors: Kazuhiro Terada, Kanagawa (JP); Akihiro Hashiguchi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 186 days.

(21) Appl. No.: 10/881,895

(22) Filed: Jul. 1, 2004

(65) Prior Publication Data

US 2005/0002005 A1    Jan. 6, 2005

(30) Foreign Application Priority Data

Jul. 3, 2003  (JP) ............................. 2003-191116
Jul. 3, 2003  (JP) ............................. 2003-191117

(51) Int. Cl.
*G03B 27/42* (2006.01)
*G03B 27/58* (2006.01)

(52) U.S. Cl. ........................................ 355/72; 355/53
(58) Field of Classification Search ................. 355/53, 355/72, 75, 77
See application file for complete search history.

(56) References Cited

U.S. PATENT DOCUMENTS 5,563,682 A * 10/1996 Aikawa et al. ............... 355/53
6,262,796 B1 * 7/2001 Loopstra et al. .............. 355/53
6,654,100 B2 * 11/2003 Yoda ............................ 355/53
6,785,005 B2 * 8/2004 Inoue .......................... 356/500
6,879,378 B2 * 4/2005 Morita et al. ................. 355/53
2003/0076482 A1 * 4/2003 Inoue ........................... 355/53

FOREIGN PATENT DOCUMENTS

JP        2000-338432 A      12/2000

* cited by examiner

*Primary Examiner*—Rodney Fuller
(74) *Attorney, Agent, or Firm*—Sughrue Mion, PLLC

(57) ABSTRACT

An image forming apparatus which can efficiently perform image forming processing to a recording medium and achieve improvement in production efficiency. In the image forming apparatus in which the recording medium is loaded onto a stage member at a loading position, the image is formed in the recording medium while the stage member passes through an image forming unit, and the recording medium in which the image has been formed is unloaded from the stage member at an unloading position, two stage members are provided. The image forming apparatus includes upper and lower circulating means in which one of the two stage members is moved below the image forming unit from the unloading position to the loading position while the other stage member passes through the image forming unit with the recording medium loaded thereon.

26 Claims, 28 Drawing Sheets

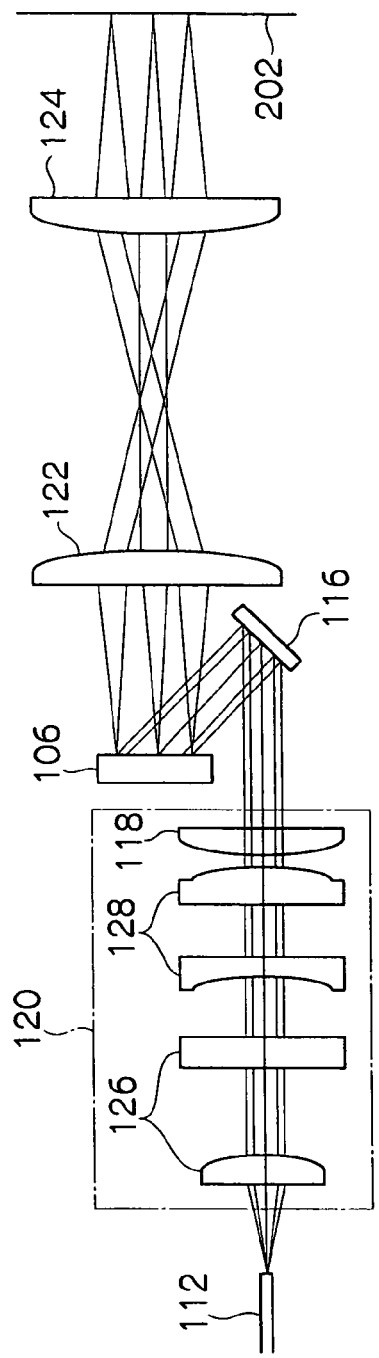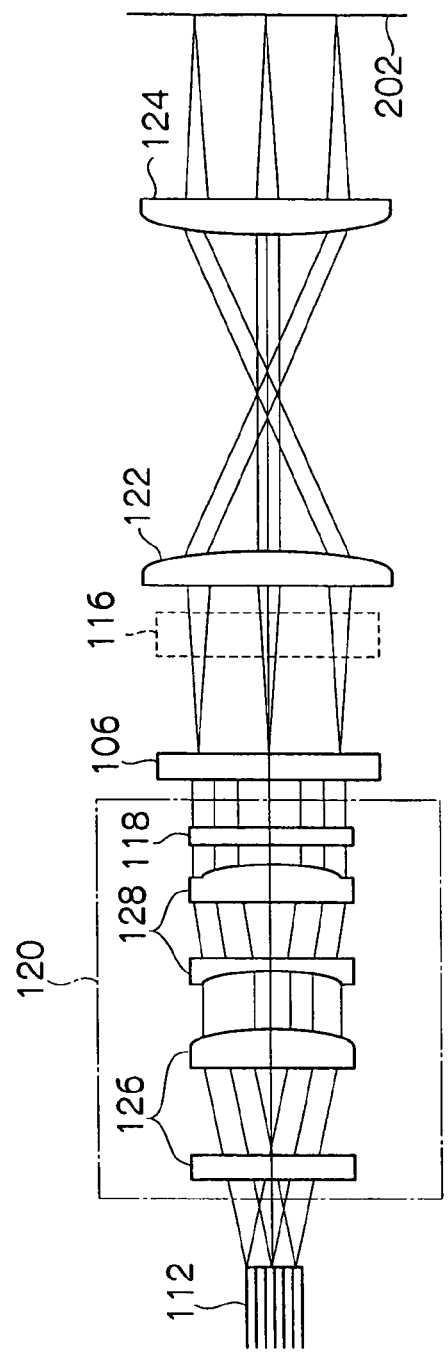
FIG.22A
FIG.22B

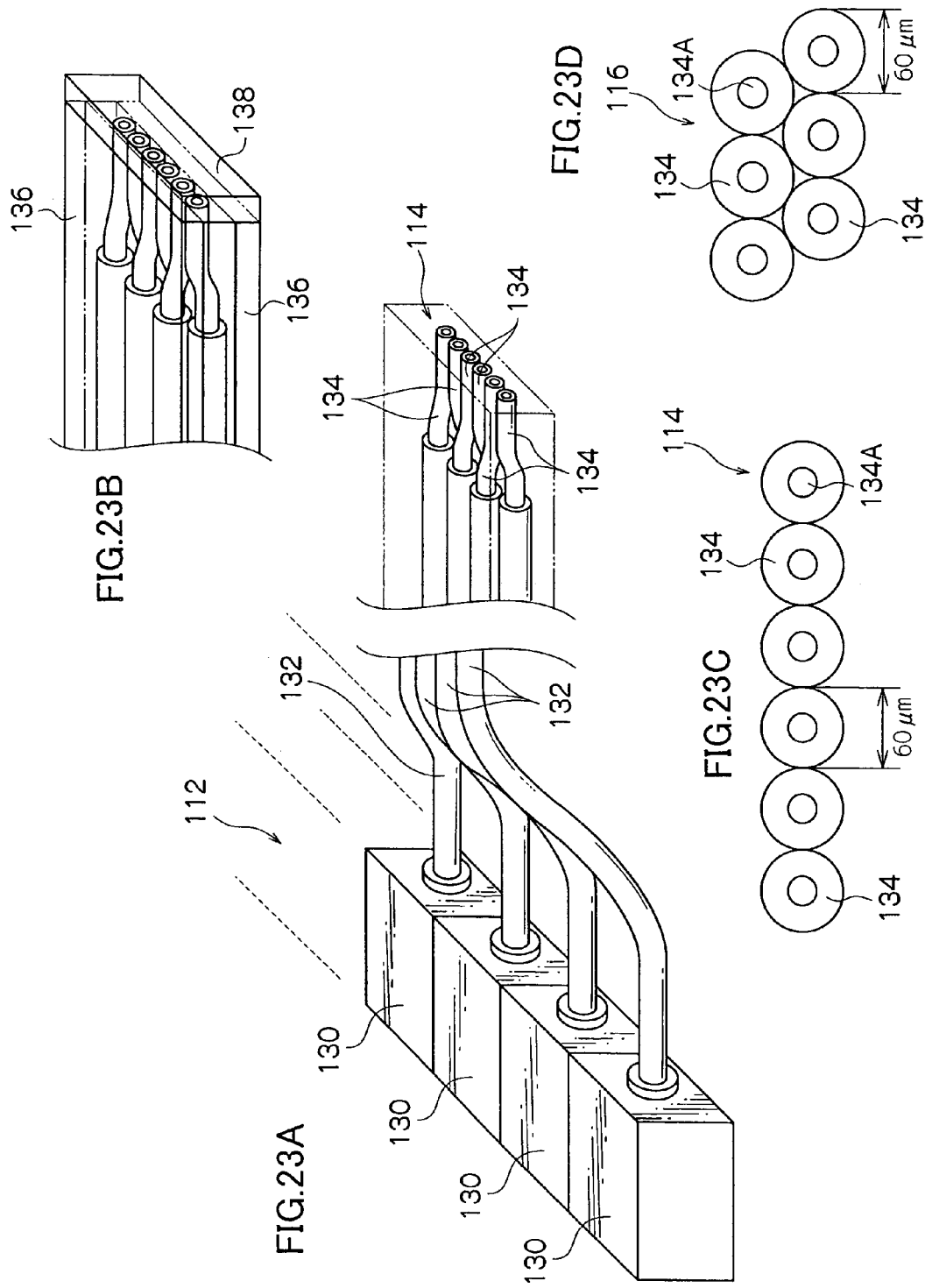

IMAGE FORMING APPARATUS

CROSS-REFERENCE TO RELATED APPLICATION

This application claims priority under 35USC 119 from Japanese Patent Application Nos. 2003-191116 and 2003-191117, the disclosure of which is incorporated by reference herein.

BACKGROUND OF THE INVENTION

1. Field of the Invention

The present invention relates to an image forming apparatus such as an exposure apparatus in which a lithography area in a recording medium such as a printed wiring board is exposed with a light beam modulated according to image information to form an image.

2. Description of the Related Art

In the conventional laser exposure apparatus which is used as an image forming apparatus for forming a wiring pattern in the printed wiring board, the printed wiring board which becomes a subject of image exposure is loaded on a conveying stage member, and alignment marks provided at four corners of the printed wiring board are picked up with a CCD camera at a predetermined reading position while the stage member is moved in a sub-scanning direction at a predetermined speed. Then, alignment processing is executed with respect to image information by performing coordinate transformation of a subject area of lithography in a lithography coordinate system in accordance with a position of the printed wiring board obtained by the image pickup.

At a predetermined exposure position, a laser beam is modulated on the basis of the image information and deflected in a main scanning direction by a polygon mirror. Then, exposure processing is performed on the basis of the image information in such a manner that a photosensitive coating film formed on the printed wiring board is scanned and exposed with the laser beam, namely, an image (latent image) corresponding to a wiring pattern is formed in a predetermined area (lithography area) in the printed wiring board. The printed wiring board in which the image is formed is unloaded from a stage member, and the stage member from which the printed wiring board has been removed returns (horizontally moves) to an initial position and is transferred to the next process in which the next printed wiring board is exposed (for example, see Japanese Patent Application Laid-Open (JP-A) No. 2000-338432).

However, in the laser exposure apparatus adopting the above-described method, the exposure processing is not performed to the printed wiring board while an unloaded process of unloading the exposed printed wiring board from the stage member, a returning process in which the stage member returns to the initial position, a loading process of loading the unexposed printed wiring board on the stage member, and a moving process of moving the stage member to a reading position are sequentially performed. Namely, the exposure processing with respect to the printed wiring board is intermittently performed by time set aside for the above-described processes, so that production efficiency is not good. Therefore, improvement in the production efficiency has become a problem.

SUMMARY OF THE INVENTION

In view of the foregoing, it is an object of the present invention to obtain a image forming apparatus which can effectively perform image forming processing for forming an image on a recording medium while moving the recording medium along a predetermined conveying path and can achieve improvement in production efficiency of the recording medium on which the image is formed.

In order to achieve the aforementioned object, in accordance with one first aspect of the present invention, there is provided an image forming apparatus for forming an image in a recording medium, comprising: a first stage and a second stage on each of which the recording medium can be mounted and which can each be moved along a predetermined circulating path; and a driving device which drives the second stage so that the second stage is moved independently of the movement of the first stage along the circulating path within a range in which the movement of the first stage is not obstructed, at least while the image is being formed in the recording medium on the first stage.

In accordance with another aspect of the present invention, there is provided an image forming apparatus for forming an image in a recording medium, comprising: at least three stages on each of which the recording medium can be mounted and which can each be moved along a predetermined circulating path; and a driving device which, at least while the image is being formed in the recording medium on one stage, drives remaining stages so that the remaining stages are moved independently of the movement of the one stage along the circulating path within a range in which the movement of the one stage is not obstructed.

In accordance with yet another aspect of the present invention, there is provided an image forming apparatus for forming an image in a recording medium, comprising: a plurality of stage members on each of which the recording medium can be mounted; and a circulating mechanism which circularly conveys the stage members in order of a loading position of the recording medium, a position where the image is formed in the recording medium, and an unloading position of the recording medium, the circulating mechanism conveying the stage members so that one stage member and another stage member pass above and below each other.

Other objects, features and advantages of the invention will be apparent to those skilled in the art from the explanation of the preferred embodiments of the invention illustrated in the appended drawings, and from the appended claims.

BRIEF DESCRIPTION OF THE DRAWINGS

FIG. 22A is a sectional view showing the schematic configuration of the exposure head in a subscanning direction along an optical axis, and FIG. 22B is a schematic side view of the exposure head.

FIG. 23A is a perspective view showing the schematic configuration of a fiber array light source, FIG. 23B is a partially enlarged view of the fiber array light source, FIG. 23C is a view for explaining the array of light-emission points in a laser outgoing portion, and FIG. 23D is a view for explaining the array of the light-emission points in the laser outgoing portion.

DETAILED DESCRIPTION OF THE INVENTION

A first embodiment of the present invention will be described in detail below referring to FIGS. 1 to 7.

Figure 1:
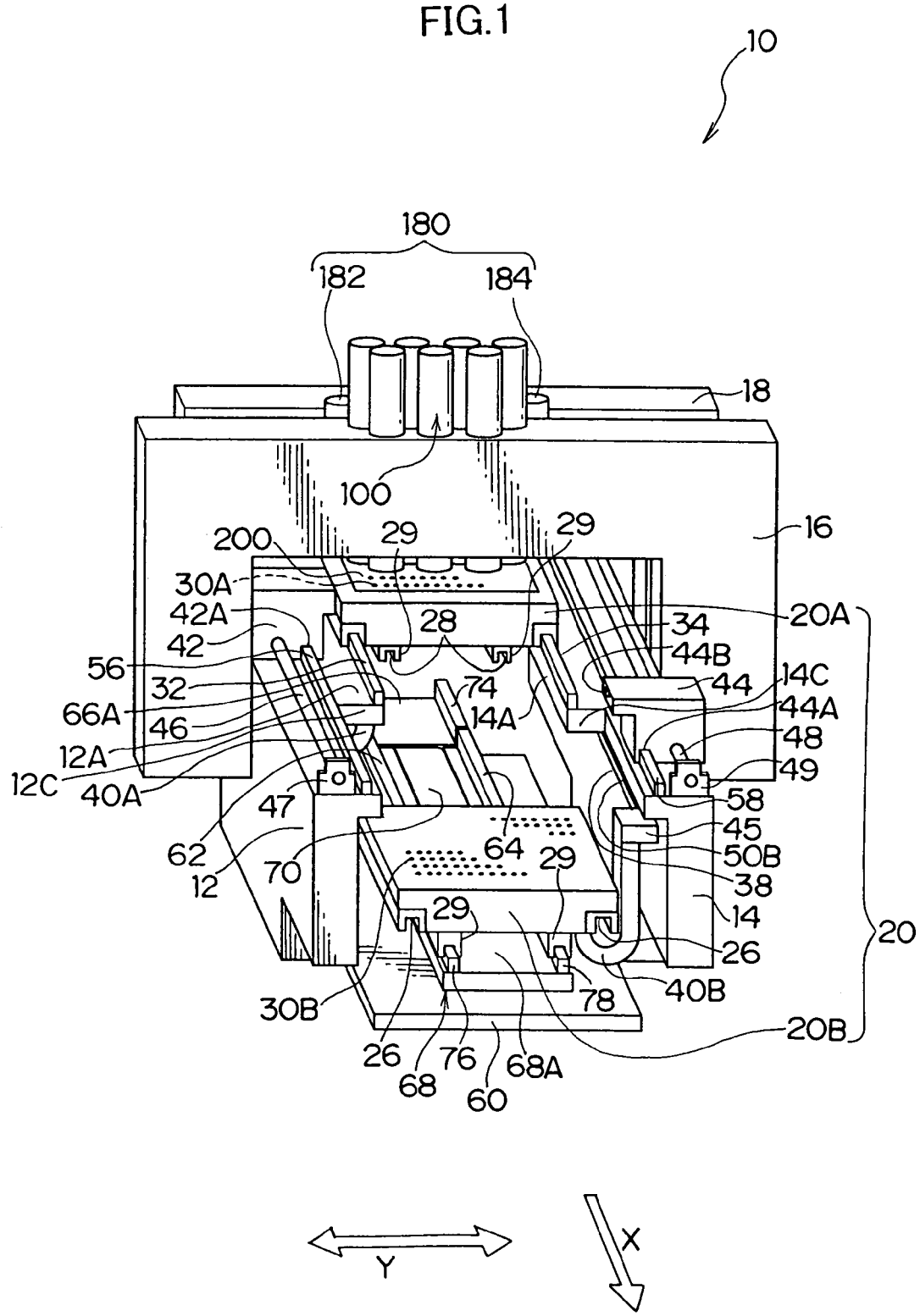
FIG. 1 is a perspective view showing a schematic configuration of a laser exposure apparatus according to a first embodiment of the present invention.
Figure 2:
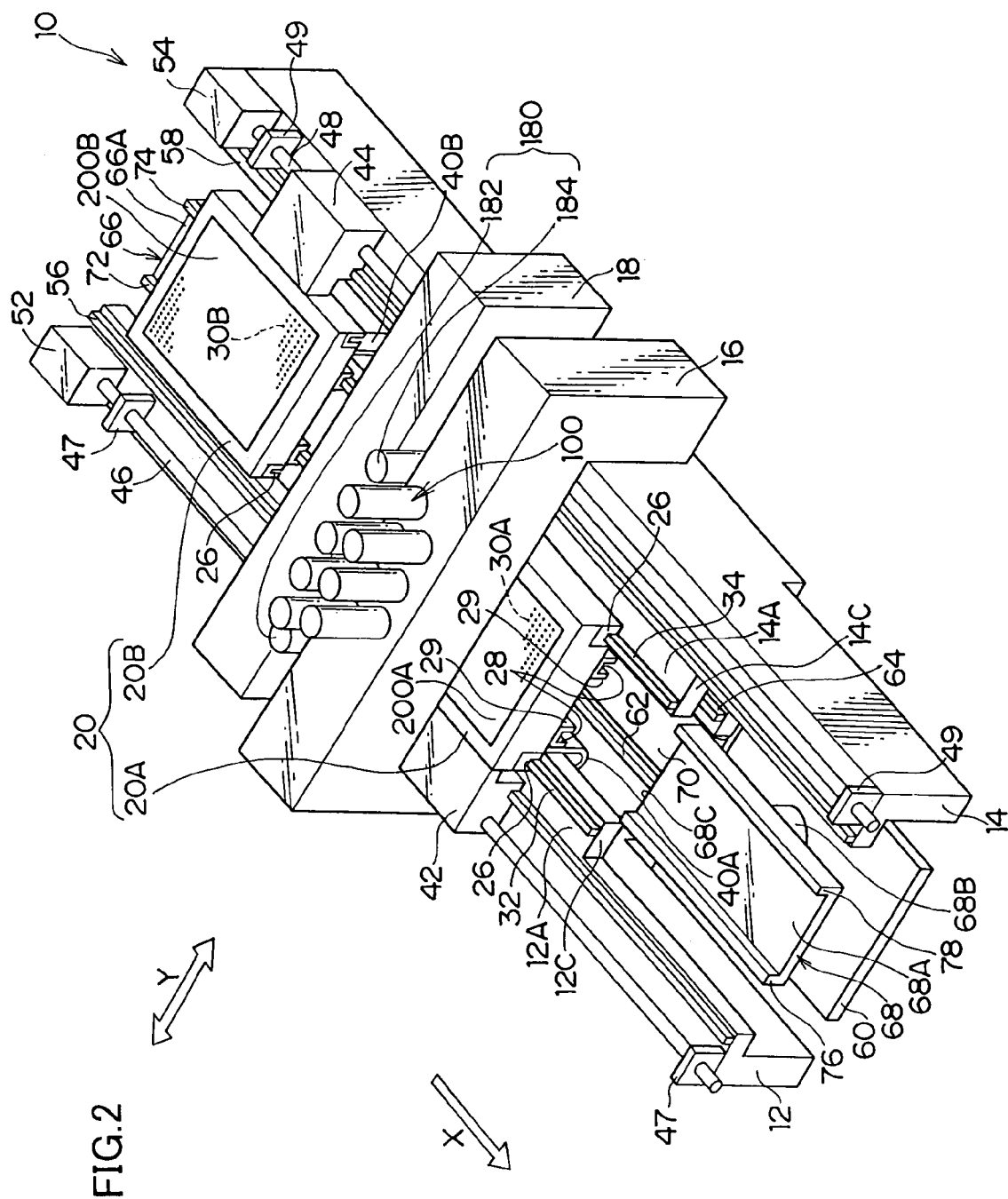
FIG. 2 is a perspective view showing the laser exposure apparatus of the first embodiment when viewed from another direction.

FIG. 1 is a schematic perspective view of the laser exposure apparatus (image forming apparatus) of the first embodiment when viewed from a front, and FIG. 2 is the schematic perspective view of the laser exposure apparatus when viewed from a side.

In a laser exposure apparatus 10, a thin plate-shaped substrate material 200 which is of the material for the printed wiring board is exposed by a laser beam B modulated by the image information while conveyed at predetermined speed, which allows the image (latent image) corresponding to the wiring pattern to be formed in the substrate material 200.

For the sake of convenience, it is assumed that a direction indicated by an arrow X in FIGS. 1 and 2 is set to "conveying direction" of the substrate material 200, and expressions such as "upstream side of conveying direction" and "downstream side of conveying direction" are used in the following description. It is assumed that the direction opposite to the conveying direction is set to "return direction" of the substrate material 200. Further, it is assumed that the direction indicated by an arrow Y orthogonal to the arrow X is set to "cross direction" of the laser exposure apparatus 10.

(Schematic Configuration of Exposure Apparatus)

As shown in FIGS. 1 and 2, the laser exposure apparatus 10 includes two substantially rectangular and plate-shaped stage members 20 having a predetermined thickness. The stage member 20 sucks and holds the substrate material 200 onto a surface (the upper surface) of the stage member 20 while moved toward the conveying direction. The two stage members 20 substantially have the same configuration, hereinafter one of the two stage members 20 is referred to as stage member 20A and the other is referred to as stage member 20B in some cases. Similarly, for the substrate material 200, the substrate material sucked and held on the stage member 20A is referred to as substrate material 200A and the substrate member sucked and held on the stage member 20B is referred to as substrate material 200B in some cases.

After the two stage members 20 are moved toward the conveying direction by an upper conveying means 42 and 44 described later and stopped at a predetermined position (on a second lifting table 68A described later), the two stage members 20 are lowered, and the two stage members 20 are moved toward the return direction by a lower conveying means 70 described later. After the two stage members are stopped at a predetermined position (on a first lifting table 66A described later), the two stage members 20 are lifted and moved toward the conveying direction again. Namely, the two stage members 20 are formed so as to be able to perform the vertically circulating movement in which each of the two stage members 20 is vertically moved and then moved toward the conveying direction and the return direction. When the stage member 20 is moved through the upper conveying path, the substrate material 200 sucked and held on the surface of the stage member 20 is exposed. After the substrate material 200 is removed, the stage member 20 is moved through the lower conveying path to return to an original initial position (loading position where the substrate material 200 is loaded).

A pair of sidewalls 12 and 14 is vertically disposed on both sides of the moving path (conveying path and return path) of the stage member 20 in symmetrical relation along the moving paths. The pair of sidewalls 12 and 14 has the same configuration. For the sake of the convenience, it is assumed that the left side of the pair of sidewalls is set to the sidewall 12 and the right side of the pair of sidewalls is set to the sidewall 14 when viewed in the front elevation in the conveying direction. In substantially central portion in 1a longitudinal direction on the sidewalls 12 and 14, two substantially U-shaped gates 16 and 18 are provided in parallel with each other so as to straddle the moving path of the stage member 20 while separated from each other with a predetermined interval. In FIGS. 1 and 2, the gates 16 and 18 are close to each other. However, actually the gates 16 and 18 are separated from each other at a distance of a length along the conveying direction of the stage member 20 or more.

Lower portions of the gates 16 and 18 are fixed to outside surfaces of the sidewalls 12 and 14 respectively. A plurality of exposure heads 100 is attached to the upper portion of the gate 16 located on the downstream side and two CCD cameras 182 and 184 constituting an image position detector 180 are attached to the upper portion of the gate 18 on the upstream side. The exposure heads 100 are fixed downward so that the exposure heads 100 can irradiate the substrate material 200 passing through the gate 16 (image forming unit) with the laser beam B. The CCD cameras 182 and 184 are also fixed downward so as to be able to take the image of an alignment mark for position (lithography area) detection of the substrate material 200 passing through the gate 18.

The laser exposure apparatus 10 is mainly operated as follows. The substrate material 200A is conveyed while sucked and held on the stage member 20A, and the CCD cameras 182 and 184 take the image of the alignment mark to detect the position (lithography area) of the substrate material 200A. The predetermined lithography area is exposed by the exposure heads 100 on the basis on the detection result. When the exposure is finished, the substrate material (printed wiring board) 200A is unloaded from the stage member 20A. On the other hand, at the time when the substrate material 200A is removed from the stage member 20A, the stage member 20B is already conveyed while sucking and holding the next substrate material 200B, and the CCD cameras 182 and 184 perform the position detection to start the exposure.

Namely, the stage member 20B from which the substrate material (printed wiring board) is unloaded is previously moved through the lower portion of the stage member 20A to return to the initial position (loading position) while the substrate material 200A on the stage member 20A is exposed. Further, the next substrate material 200B is loaded in the stage member 20B and the stage member 20B proceeds to a process in which the position detection is performed by the CCD cameras 182 and 184. The exposure of the substrate material 200 is continuously performed by the vertically circulating movement of the stage members 20A and 20B, so that an operating rate of the exposure head 100, i.e. production efficiency of the printed wiring board is improved. The schematic configuration of the laser exposure apparatus 10 was described above. Then, the configuration of each unit will be described in detail.

(Configuration of Exposure Head)

At first, the configuration of the exposure head 100 will be described in detail referring to FIGS. 16 to 28. As described above, the exposure head 100 is vertically provided in the upper portion of the gate 16 constructed in the cross direction of the laser exposure apparatus 10. When the substrate material 200 conveyed by the stage member 20 while sucked and held passes through the exposure position located at directly below the exposure head 100, a surface to be exposed 202 of the substrate material 200 is exposed from above the substrate material 200 by irradiation of the laser beam B modulated on the basis of the image information, and the image (latent image) corresponding to the wiring pattern of the printed wiring board is formed on the surface to be exposed 202.

The surface to be exposed 202 in which a thin photosensitive coating film is coated by a photosensitive material is formed in the upper surface of the substrate material 200, and the surface to be exposed 202 is configured so that the wiring pattern corresponding to the latent image (image) is formed by predetermined processing such as etching after the latent image is formed. The photosensitive coating film is formed by applying the liquid photosensitive material to the substrate material 200 to perform drying and hardening or by laminating the photosensitive material previously formed in the film shape.

Figure 16:
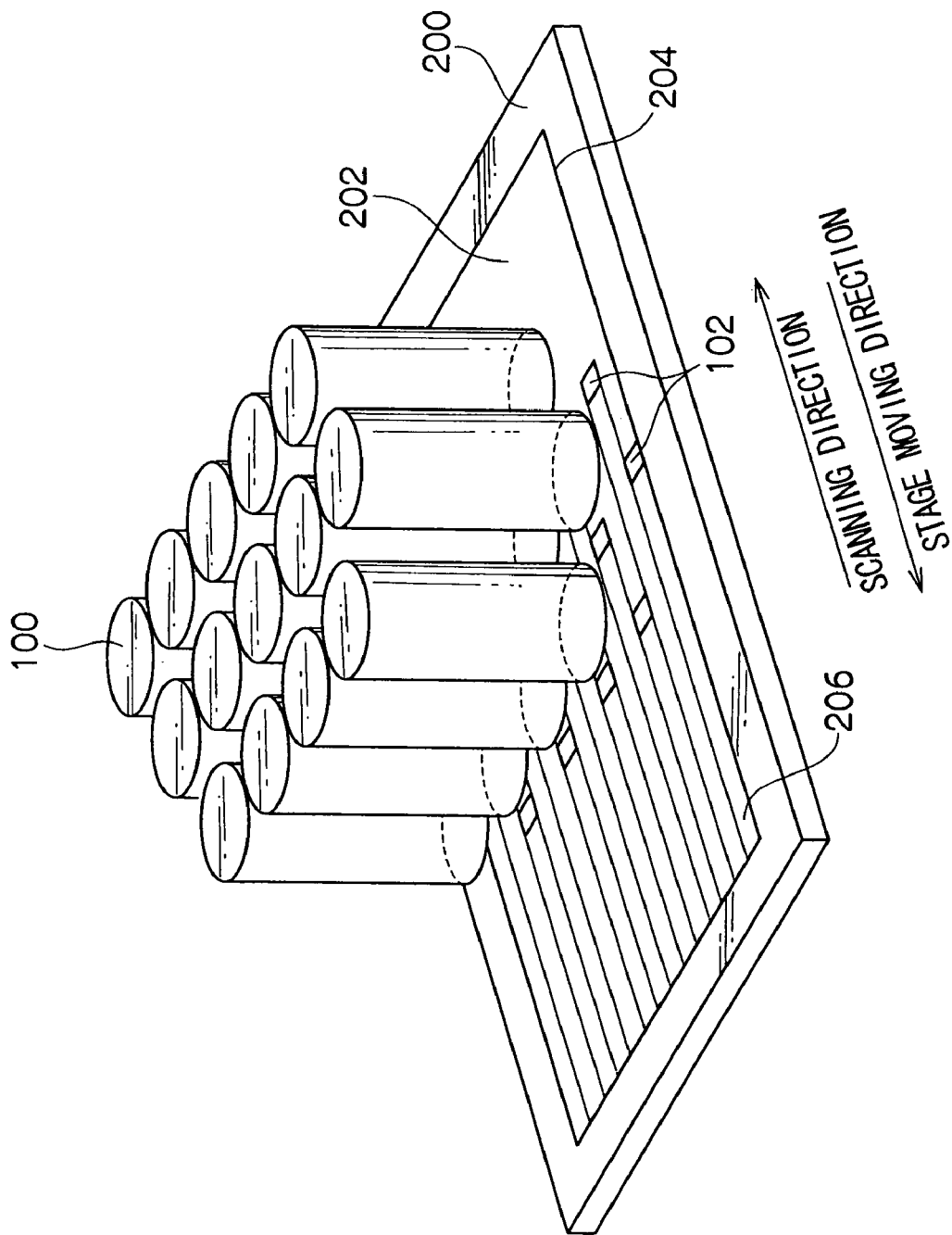
FIG. 16 is a schematic perspective view of an exposure head.
Figure 17A:
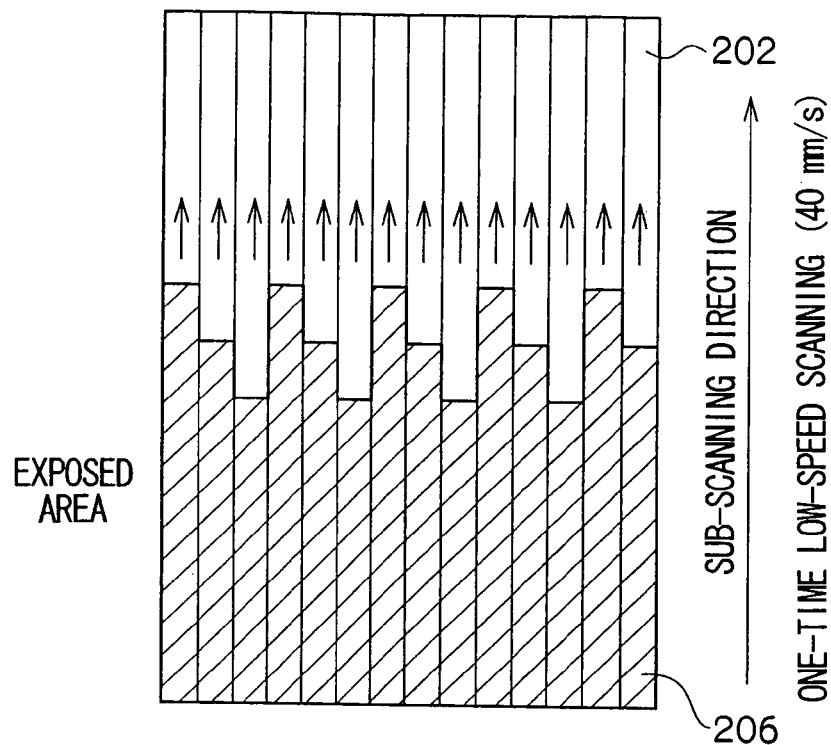
FIG. 17A is a plan view showing an exposed area formed in a substrate material.
Figure 17B:
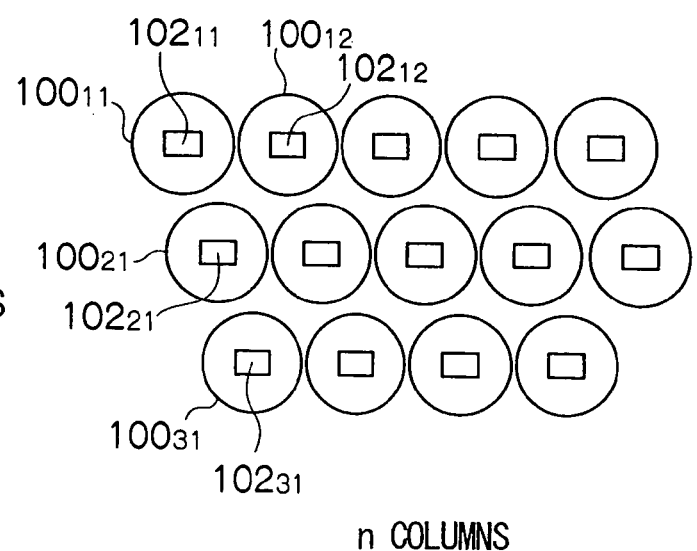
FIG. 17B is a view showing an array of the exposure area by the exposure head.

As shown in FIGS. 16, 17A and 17B, the plurality of exposure heads 100 (for example, 14 exposure heads) is formed while arrayed in a substantial matrix shape of m rows and n columns (for example, three rows and five columns). In the exposure heads 100 shown in FIGS. 16, 17A and 17B, the four exposure heads 100 are arranged in the third row because of the width of the substrate material 200. In the case where each exposure head arranged in mth row and nth column is indicated, the exposure head is denoted as exposure head $100_{mn}$.

An exposure area 102 formed by the exposure head 100 is adapted to have a rectangular shape whose short side becomes a sub-scanning direction. Consequently, in a lithography area 204 on the surface to be exposed 202 in the substrate material 200, an exposed area 206 having a strip shape is sequentially formed in each exposure head 100 by moving the stage member 20 toward the conveying direction, i.e. by relatively moving the exposure head 100 toward the sub-scanning direction. In the case where the exposure area 102 formed by each exposure head 100 arranged in mth row and nth column is indicated, the exposure area is denoted as exposure area $102_{mn}$.

As shown in FIGS. 17A and 17B, in the exposure heads 100 which are arrayed in a line so that the strip-shaped exposed area 206 are arranged without gap in the direction (main scanning direction) orthogonal to the sub-scanning direction, the exposure heads 100 are arranged while shifted from one another by the predetermined interval (multiples of a natural number of a long side of the exposure area, double in the embodiment) in the array direction. Therefore, a part where the exposure can not be performed between the exposure area $102_{11}$ and the exposure area $102_{12}$ in the first row can be exposed by the exposure area $102_{21}$ in the second row and the exposure area $102_{31}$ in the third row.

Figure 18:
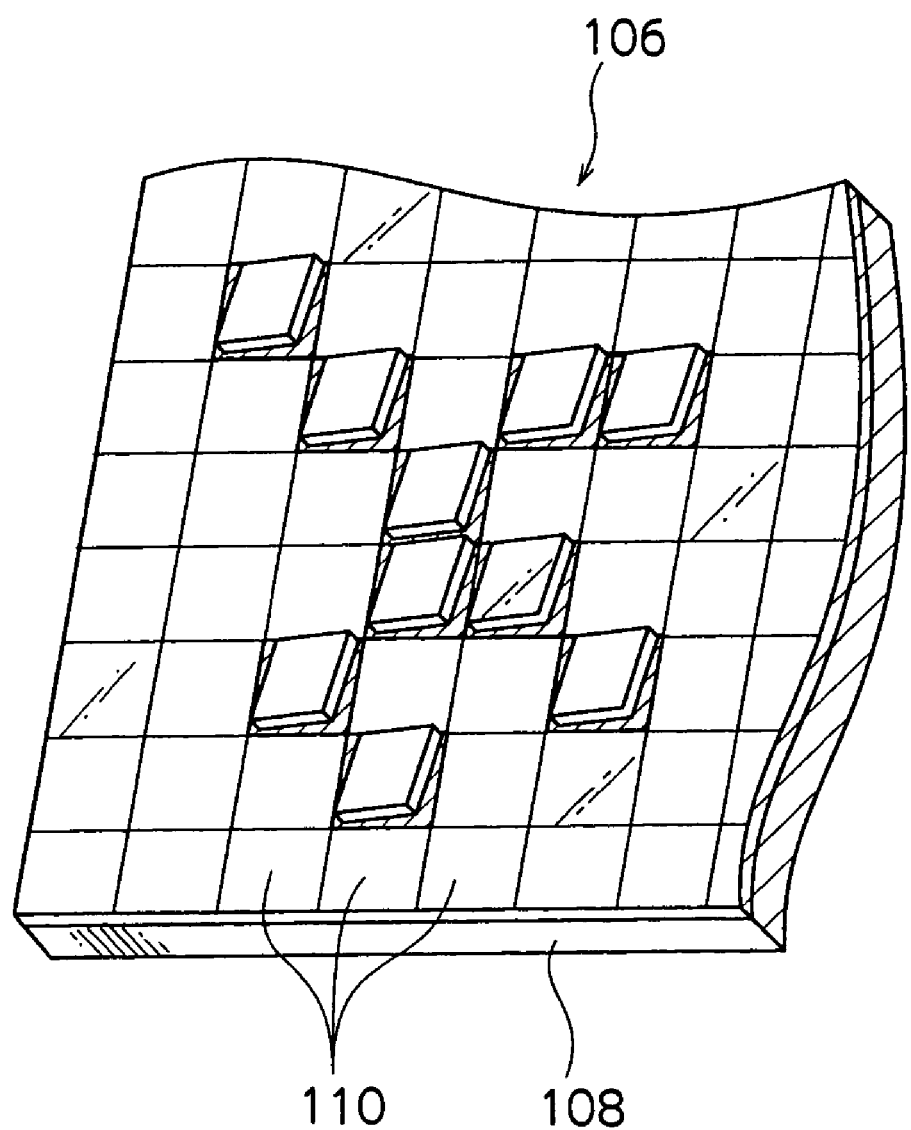
FIG. 18 is a partially expanded view showing a configuration of a digital micromirror device (DMD).

As shown in FIG. 18, each of the exposure heads $100_{11}$ to $100_{mn}$ includes a digital micromirror device (hereinafter referred to as "DMD") 106 which is of a spatial light modulator modulating the incident light beam in each pixel according to the image information. DMD 106 is a mirror device in which many micromirrors 110 (for example, 600 pieces by 800 pieces) constituting the pixel are integrally formed to be arranged in a lattice shape on SRAM cells (memory cells) 108 as shown in the figure. A material having high reflectivity such as aluminum is evaporated on the surface of the micromirror 110 so that the reflectivity becomes 90% or more. Each micromirror 110 is supported by a strut (not shown) including a hinge and a yoke.

Figure 19A:
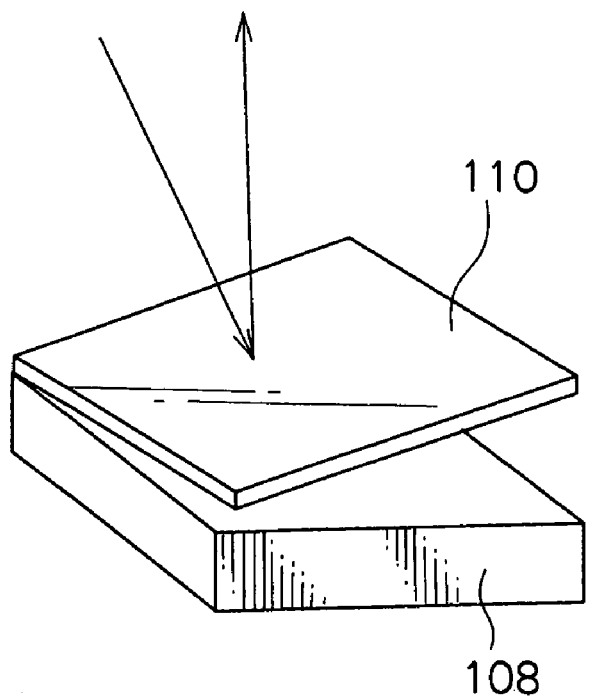
FIGS. 19A and 19B are views for explaining operation of DMD.
Figure 19B:
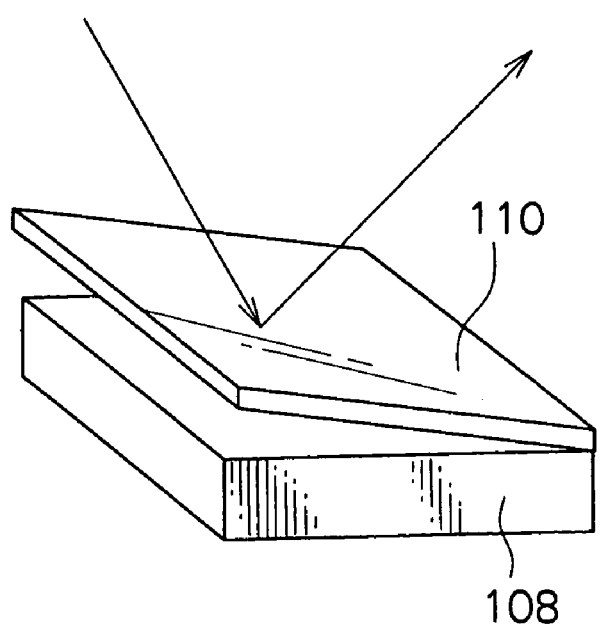

When a digital signal is written in the SRAM cell 108 of DMD 106, the micromirror 110 supported by the strut is inclined within the range of $\pm\alpha°$ (for example, $\pm10°$) about a diagonal with respect to a base side on which DMD 106 is arranged. Namely, the light incident to DMD 106 is reflected toward each inclined direction of the micromirror 110 by controlling the inclination of the micromirror 110 of DMD 106 according to the image signal. FIG. 19A shows ON-state in which the micromirror 110 is inclined at the angle of +α° and FIG. 19B shows OFF-state in which the micromirror 110 is inclined at the angle of −α°. A light absorber (not shown) is arranged in the direction in which the light beam is reflected by the micromirror 110 in OFF-state.

Figure 20A:
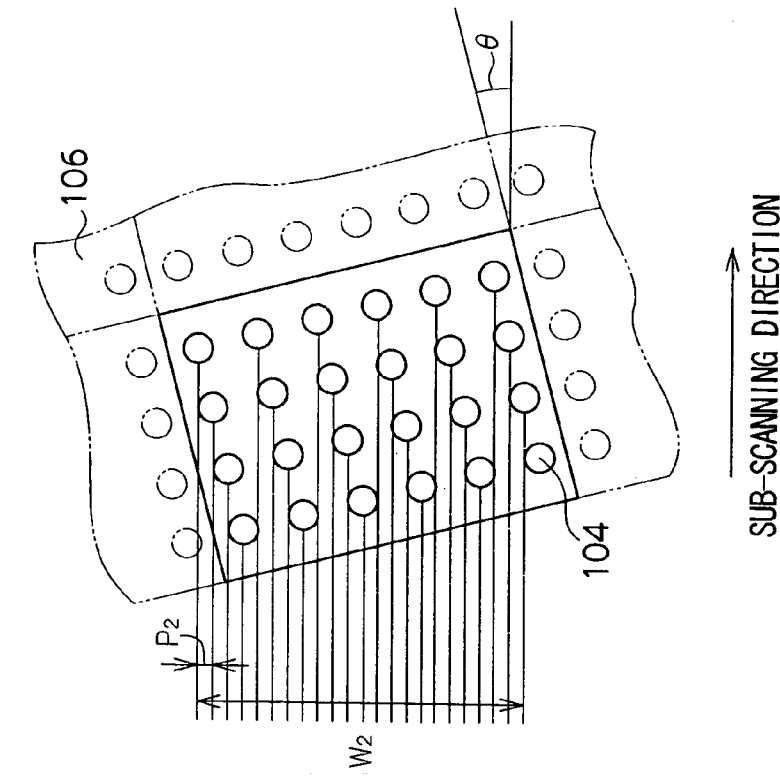
FIG. 20A is a schematic plan view showing scanning lines of an exposure beam when DMD is not inclinedly arranged, and FIG. 20B a schematic plan view showing scanning lines of the exposure beam when DMD is inclinedly arranged.
Figure 20B:
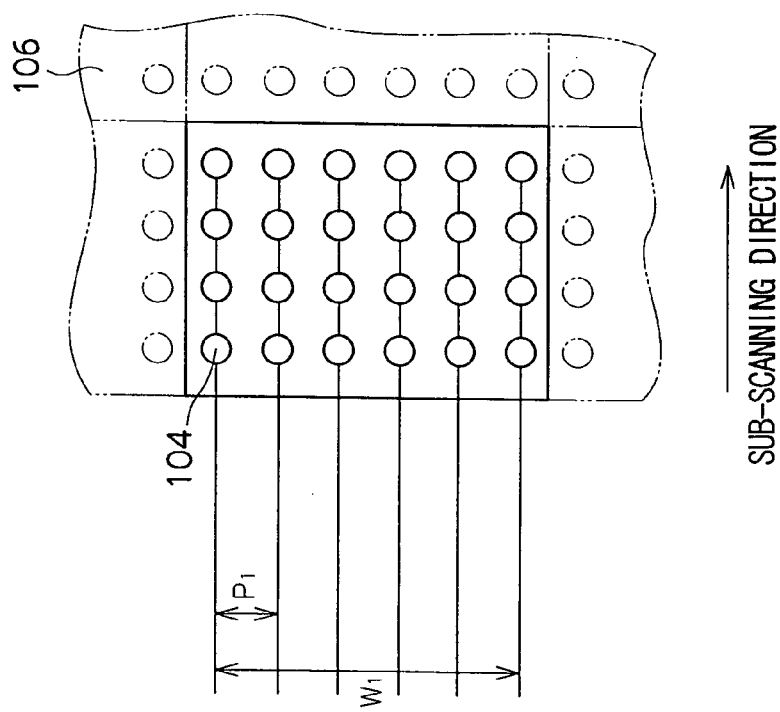

In DMD 106, as described above, many sets (for example, 600 sets) of micromirror columns in which many micromirrors 110 (for example, 800 pieces) are arrayed in the direction of the long side are array in the direction of the short side. Further, DMD 106 is arranged to be slightly inclined so that a predetermined angle θ (for example, 1° to 5°) is formed between the short side of DMD 106 and the sub-scanning direction. FIG. 20A shows a scanning trajectory of a reflected light figure (exposure beam) 104 generated by each micromirror 110 in the case where DMD 106 is not inclined, and FIG. 20B shows the scanning trajectory of the reflected light figure (exposure beam) 104 in the case where DMD 106 is inclined at the predetermined angle θ. Thus, a pitch $P_2$ of the scanning trajectory (scanning line) of the exposure beam of each micromirror 110 is narrowed by inclining DMD 106, compared with a pitch $P_1$ of the scanning line in the case where DMD 106 is not inclined, so that the resolution can be remarkably increased.

The multiple exposure of the same scanning line is performed by the different micromirror columns. As a result, the exposure position can be finely controlled, and fine exposure can be realized. Therefore, a plurality of seams between the exposure heads 100 arrayed in the main scanning direction can be connected without step by finely controlling the exposure position. Since the inclination angle θ of DMD 106 is minute, a scanning width $W_2$ in the case where DMD 106 is inclined is substantially equal to a scanning width $W_1$ in the case where DMD 106 is not inclined. Instead of the inclination of DMD 106, even if each micromirror column is arranged in a zigzag manner by shifting with a predetermined interval each micromirror column in the direction orthogonal to the sub-scanning direction, needless to say, the same effect can be also obtained.

An image information processing unit (not shown) and a mirror driving control unit (not shown) are incorporated in a control unit (not shown) which drives and controls the exposure head 100. In the image information processing unit, a control signal for driving and controlling each micromirror 110 located in the area which should be controlled in DMD 106 is generated in each exposure head 100 on the basis of the image information corresponding to the wiring pattern inputted from a controller (not shown) which controls the whole of laser exposure apparatus 10. In the mirror driving control unit, on the basis of the control signal generated in the image information processing unit, the angle of each micromirror 110 of DMD 106 is controlled in ON state or OFF state in each exposure head 100.

Figure 21:
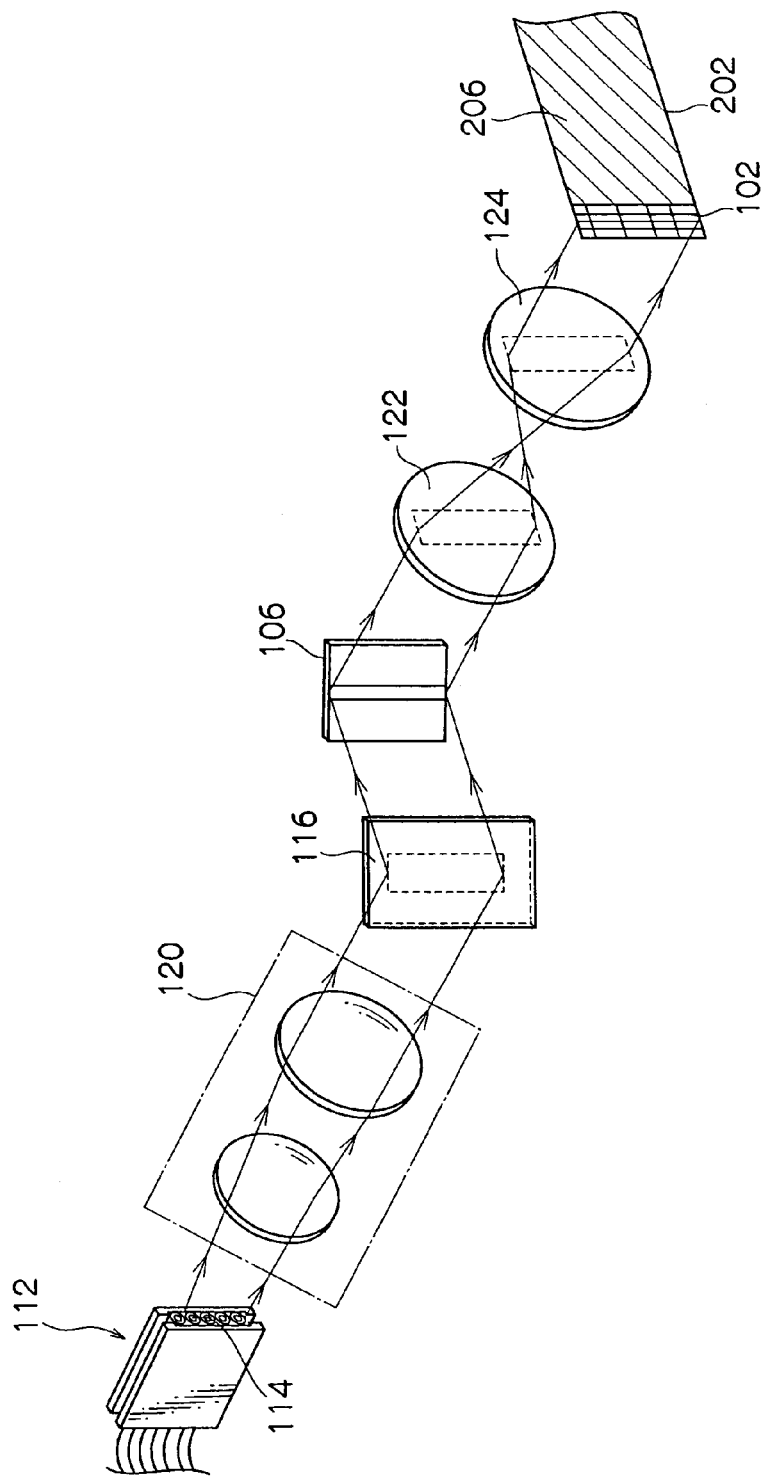
FIG. 21 is a perspective view showing the schematic configuration of the exposure head.

As shown in FIG. 21, a fiber array light source 112, a lens system 120, and a mirror 116 are arranged in order on the light incident side of DMD 106. The fiber array light source 112 includes a laser outgoing portion 114 in which outgoing end portions (light-emission points) of the optical fibers are arrayed in a line along the direction corresponding to the long side direction of the exposure area 102. The lens system 120 corrects the laser beam emitted from the fiber array light source 112 to focus the laser beam onto DMD 106. The mirror 116 reflects the laser beam transmitted through the optical system 120 toward DMD 106. Optical lens systems 122 and 124 are arranged on the light reflection side of DMD 106 so that DMD 106 and the surface to be exposed 202 become a conjugate relationship. The lens systems 122 and 124 focuses the laser beam reflected from DMD 106 on to the surface to be exposed 202 of the substrate material 200.

As shown in FIGS. 22A and 22B, the lens system 120 includes a pair of combination lenses 126, a pair of combination lenses 128, and a condenser lens 118. The pair of combination lenses 126 parallels the laser beam emitted from the fiber array light source 112. The pair of combination lenses 128 performs correction so that a light quantity distribution of the paralleled laser beam is uniformed. The condenser lens 118 focuses the laser beam in which the light quantity distribution is corrected onto DMD 106. For the array direction of laser outgoing ends, the combination lenses 128 expand light fluxes in a part near the optical axis of the combination lenses 128 and the combination lenses 128 compress the light fluxes in a part far away from the optical axis. Further, for the direction orthogonal to the array direction, the combination lenses 128 have a function of causing the light to directly pass through. Therefore, the combination lenses 128 are adapted to correct the laser beam so that the light quantity distribution is uniformed.

The fiber array light source 112 includes a plurality of laser modules 130 (for example, six modules) as shown in FIG. 23A. One end of a multi-mode optical fiber 132 is connected to each laser module 130. The other end of the multi-mode optical fiber 132 is connected to an optical fiber 134. A core diameter of the optical fiber 134 is equal to that of the multi-mode optical fiber 132, and a clad diameter of the optical fiber 134 is smaller than that of the multi-mode optical fiber 132. As shown in FIG. 23C, the laser outgoing portion 114 is formed by arraying the outgoing end portions (light-emission points) of the optical fibers 134 in a line along the main scanning direction orthogonal to the sub-scanning direction. As shown in FIG. 23D, it is also possible to array the outgoing end portions (light-emission portions) of the optical fiber 134 in two lines along the main scanning direction.

The outgoing end portion of the optical fiber 134 is fixed while sandwiched between two support plates 136 whose surfaces are flat as shown in FIG. 23B. A transparent protection plate 138 made of glass or the like is arranged on the light outgoing side of the optical fiber 134 in order to protect the end face of the optical fiber 134. It is also possible that the protection plate 138 is arranged to come into close contact with the end face of the optical fiber 134, or it is also possible that the protection plate 138 is arranged so as to seal the end face of the optical fiber 134. In the outgoing end portion of the optical fiber 134, light density is high, dust is easy to gather, and degradation is easy to occur. However, the arrangement of the protection plate 138 can prevent the dust from adhering to the end face and delay progression of the degradation.

As shown in FIG. 23B, since the outgoing ends of the optical fibers 134 having the smaller clad diameter are arrayed in a line without gap, the multi-mode optical fiber 132 is stacked between the two multi-mode optical fibers 132 adjacent to each other in a part where the clad diameter is larger, and the outgoing end of the optical fiber 134 connected to the stacked multi-mode optical fiber 132 is arrayed so as to be sandwiched between outgoing ends of the two multi-mode optical fibers 134 connected to the two multi-mode optical fibers 132 adjacent to each other in a part where the clad diameter is larger. This can be obtained by coaxially connecting the optical fiber 134 having the smaller clad diameter and a length of 1 to 30 cm to the front end on the laser beam outgoing side of the multi-mode optical fiber 132 having larger clad diameter. For example, this can be obtained by fusing and connecting the incident end face of the optical fiber 134 to the outgoing end face of the multi-mode optical fiber 132 so that central axes of the both optical fibers correspond to each other.

Figure 24:
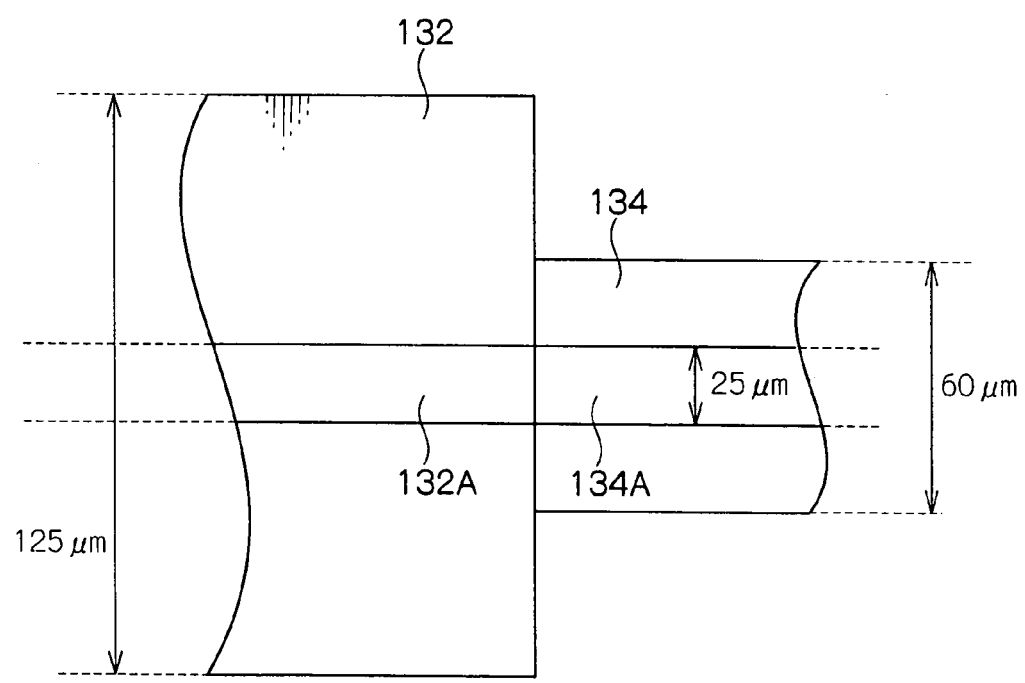
FIG. 24 is a view for explaining the configuration of a multi-mode optical fiber.

Any one of a step-index optical fiber, a grated index optical fiber, and a composite optical fiber can be used as the multi-node optical fiber 132 and the optical fiber 134. As shown in FIG. 24, the diameter of a core 134A of the optical fiber 134 is equal to the diameter of a core 132A of the multi-mode optical fiber 132. Namely, in the optical fiber 134, the clad diameter is 60 µm and the core diameter is 25 µm. In the multi-node optical fiber 132, the clad diameter is 125 µm, the core diameter is 25 µm, and the transmittance of an incident end face coat of the multi-mode optical fiber 132 is not lower than 99.5%.

It is also possible that the short optical fiber having the smaller clad diameter is fused to the short optical fiber having the larger clad diameter, is connected to the outgoing end of the multi-mode optical fiber 132 through a ferrule, an optical connector or the like. When the optical fiber having the smaller clad diameter is destroyed, the portion becomes easy to exchange by detachably connecting the short optical fiber having the smaller clad diameter to the multi-mode optical fiber 132 with the optical connector or the like, so that cost required for maintenance of the exposure head 100 can be decreased. The optical fiber 134 is hereinafter referred to as the outgoing end portion of the multi-node optical fiber 132 in some cases.

Figure 25:
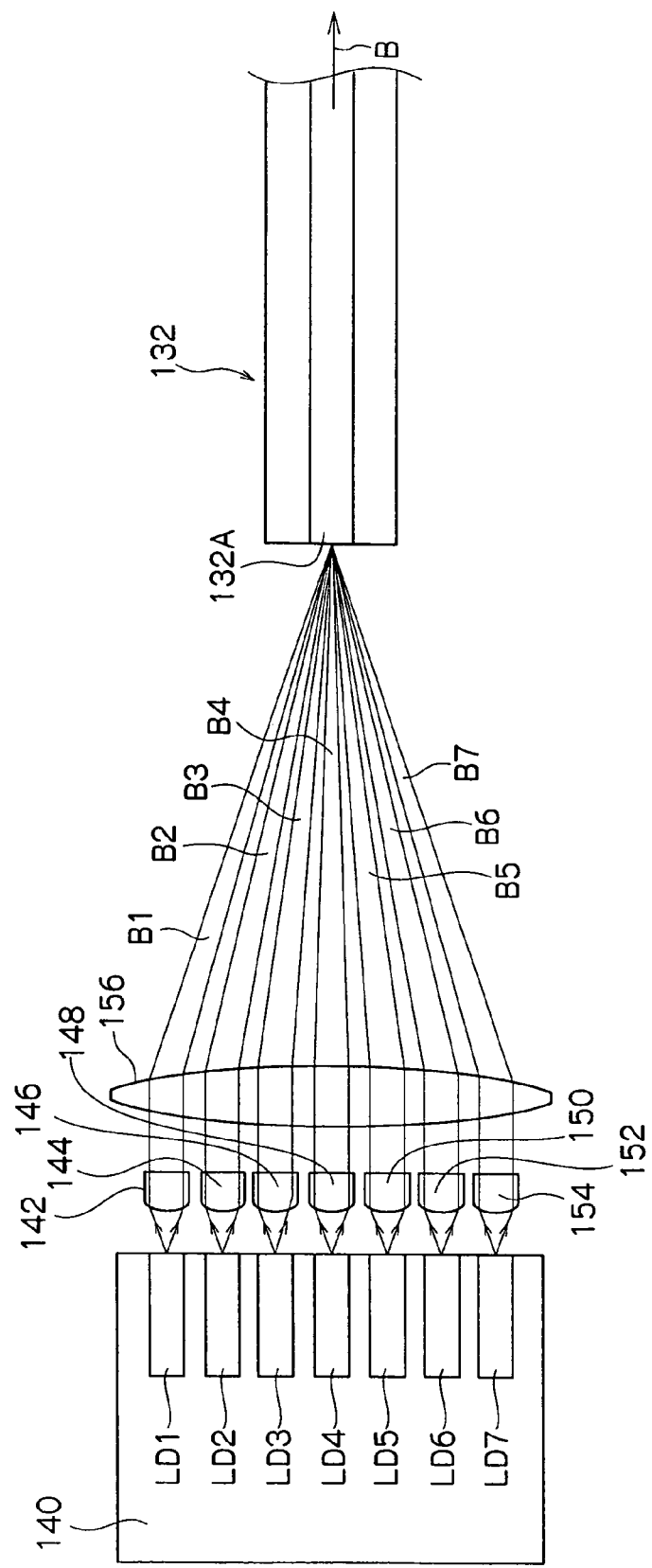
FIG. 25 is a plan view showing the schematic configuration of a multiplexing laser light source.

The laser module 130 includes a multiplex laser light source (fiber light source) shown in FIG. 25. The multiplex laser light source includes a plurality (for example seven) of chip-like lateral multi-mode or single-mode UV semiconductor lasers LD1, LD2, LD3, LD4, LD5, LD6, and LD7, collimator lenses 142, 144, 146, 148, 150, 152, and 154, a condenser lens 156, and a multi-mode optical fiber 132. The UV semiconductor lasers LD1 to LD7 are arrayed and fixed onto a heat block 140, and the collimator lenses 142 to 154 are provided corresponding to each of the UV semiconductor lasers LD1 to LD7. Namely, the condensing optical system includes the collimator lenses 142 to 154 and the condenser lens 156, and the multiplex optical system includes the condensing optical system and the multi-mode optical fiber 132.

In the exposure head 100, each of laser beams B1, B2, B3, B4, B5, B6, and B7 emitted with the laser beam divergent from the UV semiconductor laser diodes LD1 to LD7 constituting the multiplex laser light source of the fiber array light source 112 is caused to be parallel to one another by the corresponding collimator lenses 142 to 154. The parallel laser beams B1 to B7 is condensed by the condenser lens 156 to focus onto the incident end face of the core 132A of the multi-mode optical fiber 132.

The laser beams B1 to B7 focused onto the incident end face of the core 132A of the multi-mode optical fiber 132 are incident to the core 132A of the multi-mode optical fiber 132 to propagate through the optical fiber. Then, the laser beams B1 to B7 are multiplexed into one laser beam B. Assuming that the UV semiconductor lasers LD1 to LD7 have the same oscillation wavelength and the same maximum output and coupling efficiency is 85% at this time, in the case where each output of the UV semiconductor lasers LD1 to LD7 is 30 mW, the output of about 180 mW (=30 mW×0.85×7) can be obtained in the multiplex laser beam B.

The multiplex laser beam B is outputted from the optical fiber 134 connected to the outgoing end portion of the multi-mode optical fiber 132 in the above-described manner. For example, as shown in FIGS. 21 and 23C, in the case of the laser outgoing end portion 114 in which the six optical fibers 134 are arrayed (the light emission points having high luminance are arrayed in a line along the main scanning direction), the output becomes as high as about 1 W (=180 mW×6). The number of UV semiconductor lasers constituting the multiplex laser light source is not limited to seven.

Figure 26:
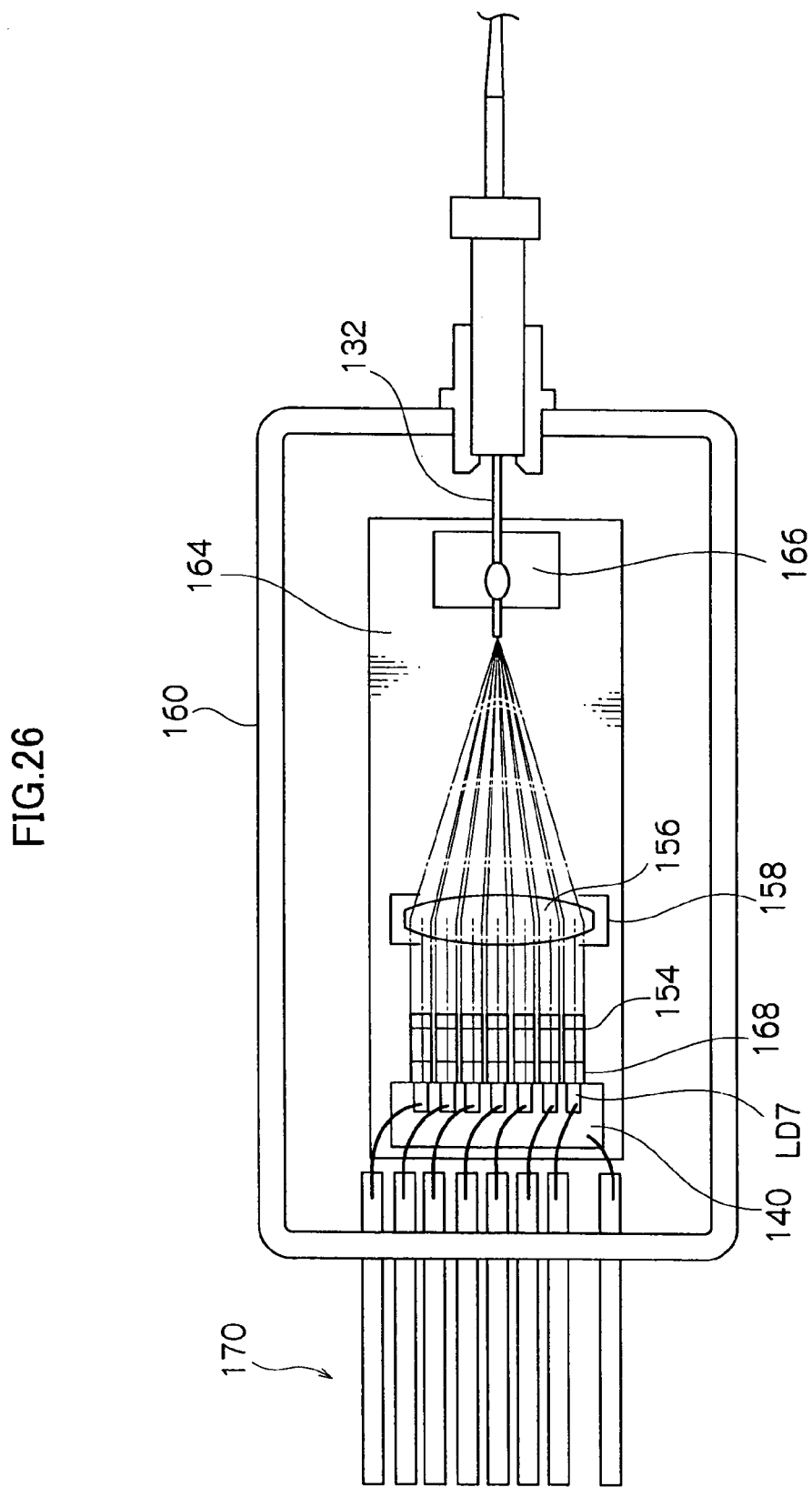
FIG. 26 is a plan view showing the schematic configuration of a laser module.
Figure 27:
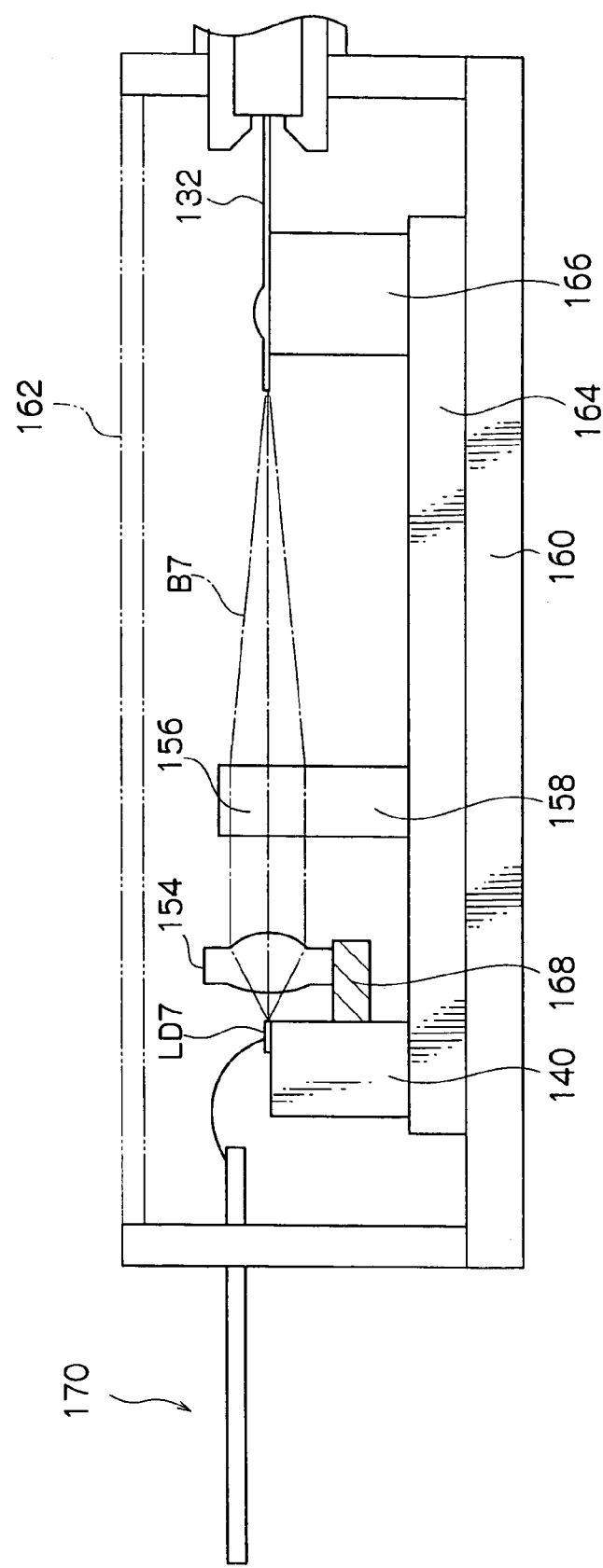
FIG. 27 is a side view of the laser module of FIG. 26.

As shown in FIGS. 26 and 27, the multiplex laser light source (UV semiconductor laser) and other optical components are stored in a box-shaped package 160 whose upper portion is opened. The package 160 includes a package top 162 which can close the opening of the package 160. The multiplex laser light source is hermetically sealed in a closed space (sealed space) formed by the package 160 and the package top 162 in such a manner that sealing gas is introduced after deaeration and the opening of the package 160 is closed by the package top 162.

A base plate 164 is fixed to a bottom of the package 160. The heat block 140, a condenser lens holder 158 for holding the condenser lens 156, and a fiber holder 166 for holding the incident end portion of the multi-mode optical fiber 132 are attached to the upper surface of the base plate 164. The outgoing end portion of the multi-mode optical fiber 132 is extracted outside the package 160 from the opening formed in a wall surface of the package 160.

A collimator lens holder 168 is attached to a side face of the heat block 140, and the collimator lenses 142 to 154 are held by the collimator lens holder 168. The opening is formed in the sidewall surface of the package 160, and wirings 170 for supplying driving current to the UV semiconductor lasers LD1 to LD7 are extracted outside the package 160 through the opening. In FIGS. 26 and 27, in order to avoid complication of the drawings, only the UV semiconductor laser LD7 is numbered in the plurality of semiconductor lasers LD1 to LD7, and only the collimator lens 154 is numbered in the plurality of collimator lenses 142 to 154.

Figure 28:
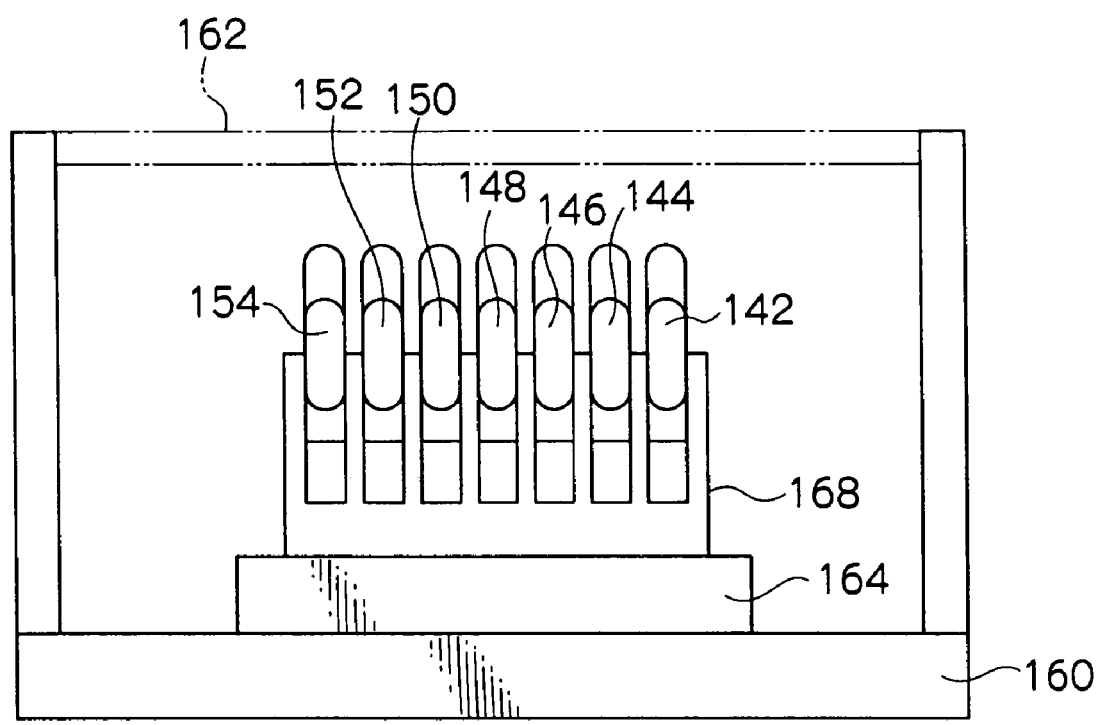
FIG. 28 is a front view of the laser module of FIG. 26.

FIG. 28 shows a front face of a part to which the collimator lenses 142 to 154 are attached. Each of the collimator lenses 142 to 154 is formed in the elongated shape in which the area including the optical axis of an aspheric circular lens is cut away by a parallel plane. The elongated-shaped collimator lens 142 to 154 can be obtained by molding resin or optical glass. The collimator lenses 142 to 154 are closely arranged in the array direction of the light-emission points of the UV semiconductor lasers LD1 to LD7 (horizontal direction in FIG. 28) so that a length direction of the collimator lenses 142 to 154 is orthogonal to the array direction of the light-emission points.

The laser, which includes an active layer whose light-emission width is 2 µm and emits the laser beams B1 to B7 while a spread angle in the direction parallel to the active layer is 10° and the spread angle in the direction orthogonal to the active layer is 30°, is used as the UV semiconductor lasers LD1 to LD7. The UV semiconductor lasers LD1 to LD7 are provided so that the light-emission points are arranged in a line in the direction parallel to the active layer. Therefore, the laser beams B1 to B7 emitted from each light-emission point are incident to the elongated-shaped collimator lenses 142 to 154 while the direction in which the spread angle of the laser beams B1 to B7 is larger corresponds to the length direction of the collimator lenses 142 to 154 and the direction in which the spread angle is smaller corresponds to the cross direction (the direction orthogonal to the length direction).

The condenser lens 156 is formed in the shape in which the area including the optical axis of the aspheric circular lens is cut away by the parallel plane so that the condenser lens 156 is longer in the array direction of the collimator lenses 142 to 154, i.e. in the horizontal direction and the condenser lens 156 is shorter in the direction orthogonal to the horizontal direction. The condenser lens 156 is also obtained by molding the resin or the optical glass.

(Configuration of Image Position Detector)

Then, the image position detector 180 will be described. The image position detector 180 includes an alignment control unit (not shown) and the two CCD cameras 182 and 184 which are vertically attached to the upper portion of the gate 18 constructed in the cross direction of the laser exposure apparatus 10 and provided on the upstream side of the exposure head 100. The two CCD cameras 182 and 184 includes a stroboscope whose one-time light-emission time is extremely short as the light source in taking the image while including a two-dimensional CCD as an image pickup device. Light-receiving sensitivity of each CCD device is set so that the image can be taken only during the light-emission of the stroboscope. In the alignment control unit, the processing of the image signal from the CCD cameras 182 and 184 is performed and the position information corresponding to the alignment mark taken by each of the CCD cameras 182 and 184 is outputted to the controller.

On the other hand, the lithography area 204 in which the latent image corresponding to the wiring pattern is previously formed is set on the surface to be exposed 202 of the substrate material 200, and the alignment marks (not shown) corresponding to the lithography area 204 are formed in the four corners of the surface to be exposed 202. The substrate material 200 is conveyed at predetermined speed while sucked and held on the stage member 20. When the substrate material 200 passes through the image taking position (a reading position) under the CCD cameras 182 and 184, the CCD cameras 182 and 184 cause the stroboscope to emit the light at predetermined timing and receive the light reflected from the substrate material 200. Therefore, the CCD cameras 182 and 184 respectively take the image taking range including the alignment marks in the substrate material 200.

The alignment mark is formed by providing a circular through-hole or a circular concave portion in the surface to be exposed 202 of the substrate material 200. Thereby the position (lithography area) of the substrate material 200 on the stage member 20 is detected by the alignment mark. The number of CCD cameras is not limited to two. The CCD cameras 182 and 184 differ from each other in the image taking ranges of the substrate material 200. Therefore, the CCD cameras 182 and 184 can be respectively adjusted the position of the CCD cameras 182 and 184 according to the position of the alignment mark formed in the substrate material 200 which is of the image taking subject. In addition to the circular through-hole or the circular concave portion, it is also possible that a land which is of the wiring pattern previously formed in the surface to be exposed 202 of the substrate material 200 is utilized as the alignment mark.

(Configurations of Stage Member and Vertically Circulating Means)

Then, the configurations of the stage member 20 and the vertically circulating means will be described in detail referring to FIGS. 1 to 7. For the sake of convenience, in the case where the stage member 20 is described by distinguishing between the stage member 20A and the stage member 20B, in accordance with the distinction between the stage members 20A and 20B, sometimes the same constituents in the stage members 20A and 20B are distinguished by marking the constituents with alphabetic characters of A and B. As described above, the stage member 20 is formed in the substantially rectangular plate shape having the predetermined thickness, and the inside of the stage member 20 is a cavity. The upper face (surface) is formed to be the plane load surface for loading the substrate material 200, many air suction small holes 30 for sucking the substrate material 200 by negative pressure are made in the load surface.

One end (hereinafter referred to as "front end portion") of a cable bearer 40 including a power line or air piping, which becomes a negative pressure generation cable to the stage member 20, is connected to the lower surface portion of the stage member 20. The other end (hereinafter referred to as "base portion") 45 of the cable bearer 40 is connected to the cable bearer 50 similarly including the power line or the air piping. Namely, in the case where the stage member 20 includes a vacuum generation device (not shown) such as a vacuum pump for air suction, the cable bearers 40 and 50 become the cable bearer including the power line for driving the vacuum generation device. In the case where the stage member 20 does not include the vacuum generation device, the cable bearers 40 and 50 become the cable bearer including the air piping connected to the vacuum generation device, such as a vacuum pump, which is separately placed.

The front end portions of the cable bearers 40A and 40B are connected to the lower surface portion of the stage member 20A near the sidewall 12 (between a first guide groove 26 and a rail 29 described later) and the lower surface portion of the stage member 20B near the sidewall 14 (between the first guide groove 26 and the rail 29 described later) respectively. The cable bearers 40A and 40B is formed by a flexible tube so as to be able to be deformed by following the stage members 20A and 20B which are vertically moved. The cable bearers 50A and 50B are slidably provided in guide grooves 36 and 38 which are formed inside the sidewalls 12 and 14 and are parallel to the conveying direction (return direction) respectively. Further, the cable bearers 50A and 50B are formed so that the cable bearers 50A and 50B and the base portion 45 can be moved in the conveying direction and the return direction along the guide groove 36 and 38.

Even if the stage members 20A and 20B are moved in the vertical direction, the conveying direction, and the return direction, the cable bearers 40A and 40B and the cable bearer 50A and 50B can be moved by following the stage members 20A and 20B. Therefore, the problem that the cable bearers 40 and 50 are entangled or the problem that the cable bearers 40 and 50 become an obstacle never occurs, and the problem that the cable bearers 40 and 50 interrupt the movement of each of the stage members 20A and 20B never occurs.

It is desirable that the guide grooves 36 and 38 is formed only within the range of the movement of the base portion 45 and the cable bearers 50A and 50B is extracted outside from through-holes 12B and 14B (the through-hole is shown only in sidewall 12 in FIG. 7) made in the end portions of the upstream sides (downstream sides in some cases) in the guide grooves 36 and 38. It is also possible that the guide grooves 36 and 38 are extended to the end portions of the upstream sides (downstream sides) of the sidewalls 12 and 14 and the cable bearers 50A and 50B are extracted from the end portions. In each case, the cable bearer 50 is formed so as not to be protruded from the guide grooves 36 and 38 to the lower portion of the stage member 20 by flexure deformation, and the electric power or the negative pressure is supplied to the stage member 20 as needed.

In the upper surface of the sidewall 12, a ball screw 46 and a guide rail 56 are provided throughout the total length of the sidewall 12 while being parallel to the conveying direction (return direction). Similarly, in the upper surface of the sidewall 14, a ball screw 48 and a guide rail 58 are provided throughout the total length of the sidewall 14 while being parallel to the conveying direction (return direction). Motors 52 and 54 which can be normally and reversely rotated are attached onto the end portions of the upstream sides (or downstream sides) of the ball screws 46 and 48 respectively. The motors 52 and 54 are configured to be rotated by a drive pulse signal outputted from a conveying control unit (not shown), and the conveying control unit is connected to the controller.

The neighborhoods of both end portions of the ball screws 46 and 48 are supported by a pairs of support portions 47 and 49. In the ball screws 46 and 48 between support portions 47 and 49, linear traveling bodies 42 and 44 which are of upper conveying means for conveying the stage members 20A and 20B are provided while engaging the ball screws 46 and 48 respectively. The linear traveling bodies 42 and 44 move the stage members 20A and 20B toward the conveying direction respectively. Hole portions having screw threads are provided in the lower portions outside the linear traveling bodies 42 and 44 while protruded. The ball screws 46 and 48 are inserted through the hole portions while threaded in the hole portions.

Guide grooves 42A and 44A are formed in the lower portions whose sections have U-shape inside the linear traveling bodies 42 and 44. The guide grooves 42A and 44A are slidably fitted to the guide rails 56 and 58 respectively. When the motor 52 and 54 are driven by the drive pulse signal to rotate normally and reversely the ball screws 46 and 48, the linear traveling bodies 42 and 44 can travel in the conveying direction and the return direction along the guide rails 56 and 58 at predetermined speed (for example, 30 mm/s in exposure).

In the stage member 20A, a U-shaped joint portion 22 is provided on the side face portion opposite to the sidewall 12 while protruded from the side face. Similarly, in the stage member 20B, a U-shaped joint portion 24 is provided on the side face portion opposite to the sidewall 14 while protruded from the side face. Joint portions 42B and 44B are provided on the upper portion inside the linear traveling bodies 42 and 44 provided on the upper surface of the sidewalls 12 and 14 while protruded respectively. The joint portions 42B and 44B is fitted between the U-shaped joint portions 22 and 24 by the insertion from the vertical direction.

The joint portions 42B and 44B are detachably connected to the joint portions 22 and 24 by lifting and lowering the stage members 20A and 20B, and the linear traveling bodies 42 and 44 are moved in the conveying direction, which allows the stage members 20A and 20B are pulled and moved toward the conveying direction. Namely, the connections between the joint portions 22 and 24 of the stage members 20A and 20B and the joint portions 42B and 44B of the linear traveling bodies 42 and 44 are easily disconnected in the vertical direction respectively, however, the connections between the joint portions 22 and 24 and the joint portions 42B and 44B are not disconnected in the horizontal direction. This allows the stage members 20A and 20B to be moved toward the conveying direction.

Therefore, it is not necessary to provide an automotive mechanism in the stage members 20A and 20B, and the configuration of the stage members 20A and 20B can be simplified. The connections between the linear traveling bodies 42 and 44 and the stage members 20A and 20B are released by lowering the stage members 20A and 20B, the linear traveling bodies 42 and 44 are moved toward the return direction, the linear traveling bodies 42 and 44 are connected to the stage members 20A and 20B again at the initial position (loading position) by lifting the stage members 20A and 20B, and the stage members 20A and 20B are sequentially moved toward the conveying direction.

In the stage members 20A and 20B, a pair of first guide grooves 26 whose sections have substantially U-shape are provided along the conveying direction (return direction) while protruded in the lower surface portion (lower portions of both sides of stage member 20) on the outside of the position where the front end portion is connected. Further, a pair of rails 29 including a second guide grooves 28 whose section have substantially U-shape are provided along the conveying direction (return direction) while protruded in the lower surface portion on the inside of the position located inside the position where the front end portions of the cable bearers 40A and 40B are connected.

Overhang portions 12A and 14A are integrally provided in the substantially central portions of the upper surfaces of the sidewalls 12 and 14. The overhang portions 12A and 14A overhang toward the inside with a predetermined width, and the overhang portions 12A and 14A are long in the conveying direction. Upper guide rails 32 and 34 to which the first guide grooves 26 are slidably fitted are provided on the overhang portions 12A and 14A along the conveying direction (return direction) while protruded. The upper guide rails 32 and 34 are provided throughout the total length of the overhang portions 12A and 14A.

A plate-shaped setting stage 60 having the predetermined thickness is arranged in the lowest portion between the sidewalls 12 and 14. The setting stage 60 has the substantially same length as the length direction (conveying direction and return direction) of the sidewalls 12 and 14 and has the substantially same width as the distance between the sidewalls 12 and 14. On the setting stage 60 which corresponds to the lower portions of the overhang portions 12A and 14A when viewed in the side view, a pair of lower guide rails 62 and 64 is provided along the conveying direction (return direction) while protruded. The second guide grooves 28 are slidably fitted to the lower guide rails 62 and 64 respectively, and the lower guide rails 62 and 64 have the substantially same length as the overhangs 12A and 14A (upper guide rails 32 and 34).

Accordingly, a track width between the lower guide rails 62 and 64 which become the guide when the stage member 20 is moved toward the return direction is narrower than the track width between the upper guide rails 32 and 34 which become the guide when the stage member 20 is moved toward the conveying direction. When the laser exposure apparatus 10 has the above-described configuration, the cable bearer 40 connected to the stage member 20 can be formed so as not interfere with the upper guide rails 32 and 34 and the lower guide rails 62 and 64. Namely, the cable bearer 40 is connected between the first guide groove 26 and the second guide groove 28 (rail 29) and there is a predetermined interval between the overhang portions 12A and 14A in the cross direction, so that the cable bearer 40 is moved between the overhang portions 12A and 14A when the stage member 20 is moved toward the conveying direction while the lower portions of the both ends of the stage member 20 are supported by the upper guide rails 32 and 34.

When the stage member 20 is moved along the lower guide rails 62 and 64, because the rails 29 (second guide grooves 28) supported by the lower guide rails 62 and 64 are located inside the cable bearer 40, the cable bearer 40 is moved outside the lower guide rails 62 and 64. When the track width between the lower guide rails 62 and 64 is formed to be different from (to be narrowed) the track width between the upper guide rails 32 and 34, the cable bearer 40 can be moved so as to follow the stage member 20 without interrupting the movement of the stage member 20.

A first lift 66 and a second lift 68 are provided in the end portions on the upstream side and the downstream side of the setting stage 60 respectively. The first lift 66 and the second lift 68 lift and lower the stage member 20. The first lift 66 and the second lift 68 having the same configuration respectively include a first cylinder 66B and a second cylinder 68B which are vertically moved within the predetermined height by oil pressure or the like. The first cylinder 66B and the second cylinder 68B correspond to an example of a first lifting member and a second lifting member in the invention respectively.

A first lifting table 66A and a second lifting table 68A are horizontally attached to the upper portions of the first cylinder 66A and the second cylinder 68B in an integral manner. The first lifting table 66A and the second lifting table 68A having the rectangular plate shapes are long in the conveying direction (return direction). First changing rails 72 and 74 and second changing rails 76 and 78 are provided on the first lifting table 66A and a second lifting table 68A while protruded respectively. The first changing rails 72 and 74 and the second changing rails 76 and 78 have the same intervals (track width) as the lower guide rails 62 and 64. Therefore, the stage member 20 has the configuration in which the stage member 20 is supported by the first changing rails 72 and 74 or the second changing rails 76 and 78 through the second guide grooves 28 (rails 29) when located on the first lifting table 66A and the second lifting table 68A.

Figure 4:
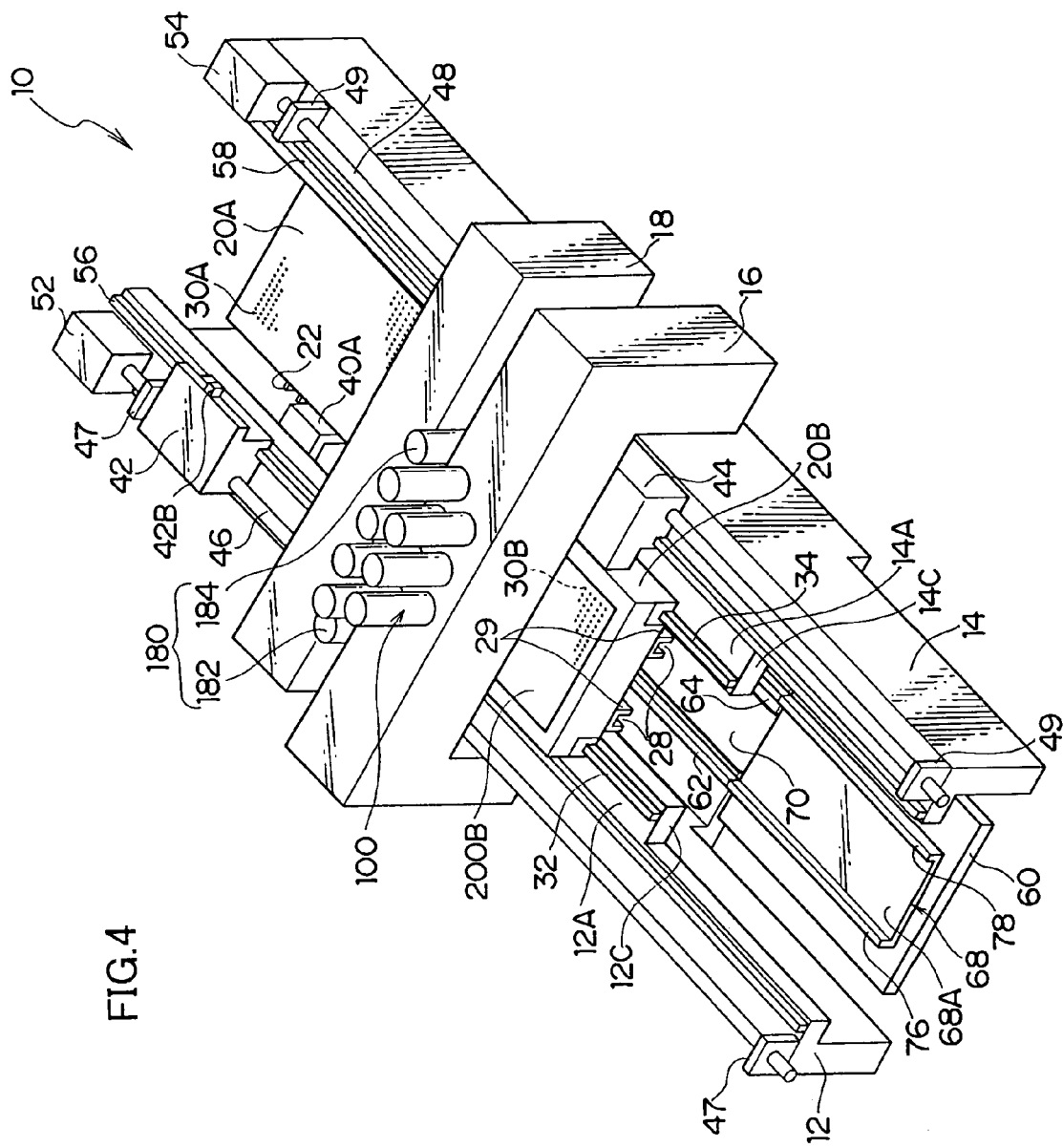
FIG. 4 is a perspective view showing the laser exposure apparatus of the first embodiment which is in another operating state.

The length in the conveying direction of the first lifting table 66A and the second lifting table 68A is determined in consideration of the length in the conveying direction of the substrate material 200, and also considering that the first changing rails 72 and 74 and second changing rails 76 and 78 are continuously and integrally connected to the lower guide rails 62 and 64 when the first lifting table 66A and the second lifting table 68A are lowered (see FIG. 4). When the first changing rails 72 and 74 and second changing rails 76 and 78 are continuously and integrally connected to the lower guide rails 62 and 64, delivery and receipt of the stage member 20 to the lower guide rails 62 and 64 can be easily and smoothly performed.

Figure 7:
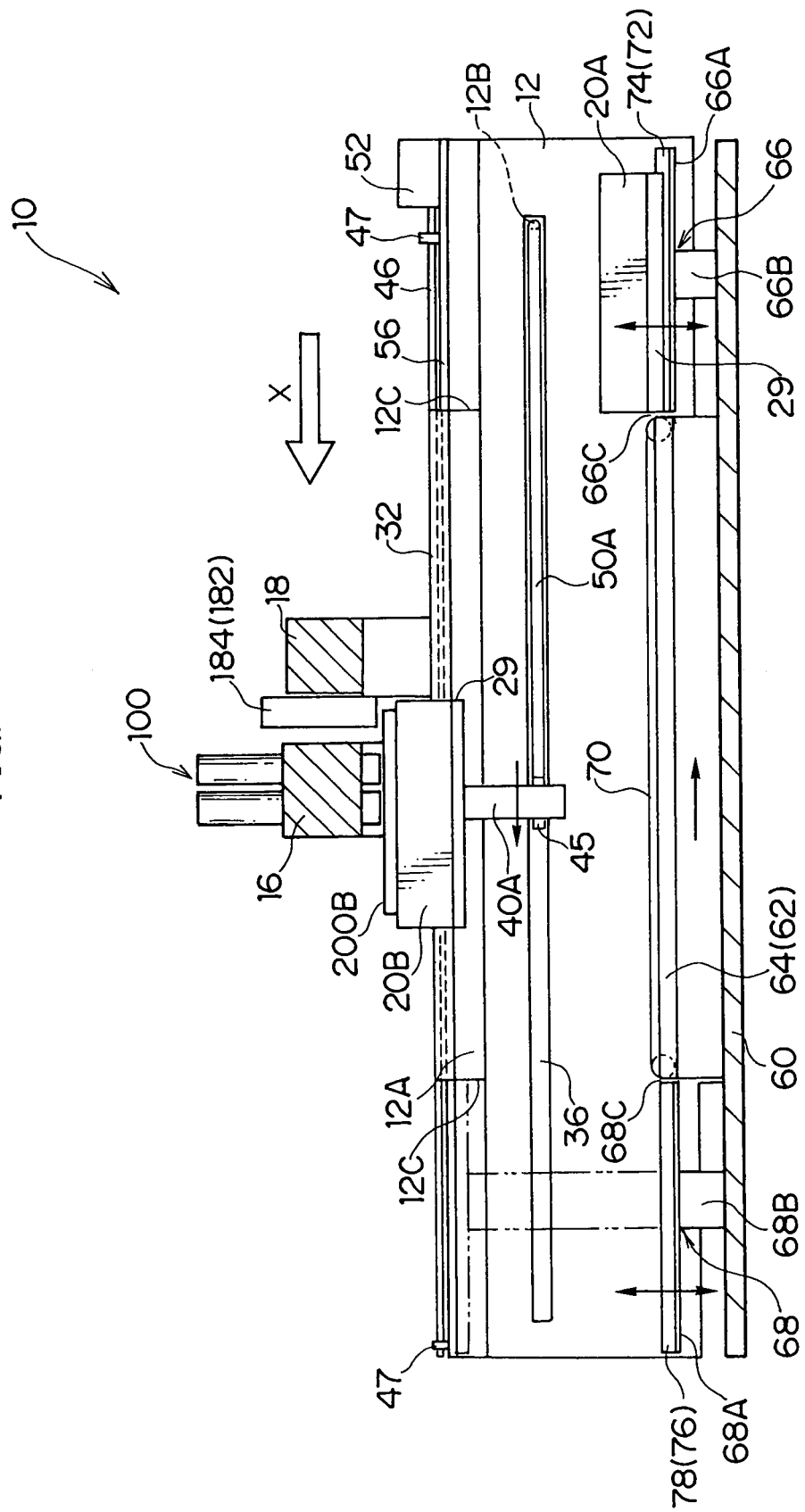
FIG. 7 is a length sectional view showing the laser exposure apparatus of the first embodiment.
Figure 8:
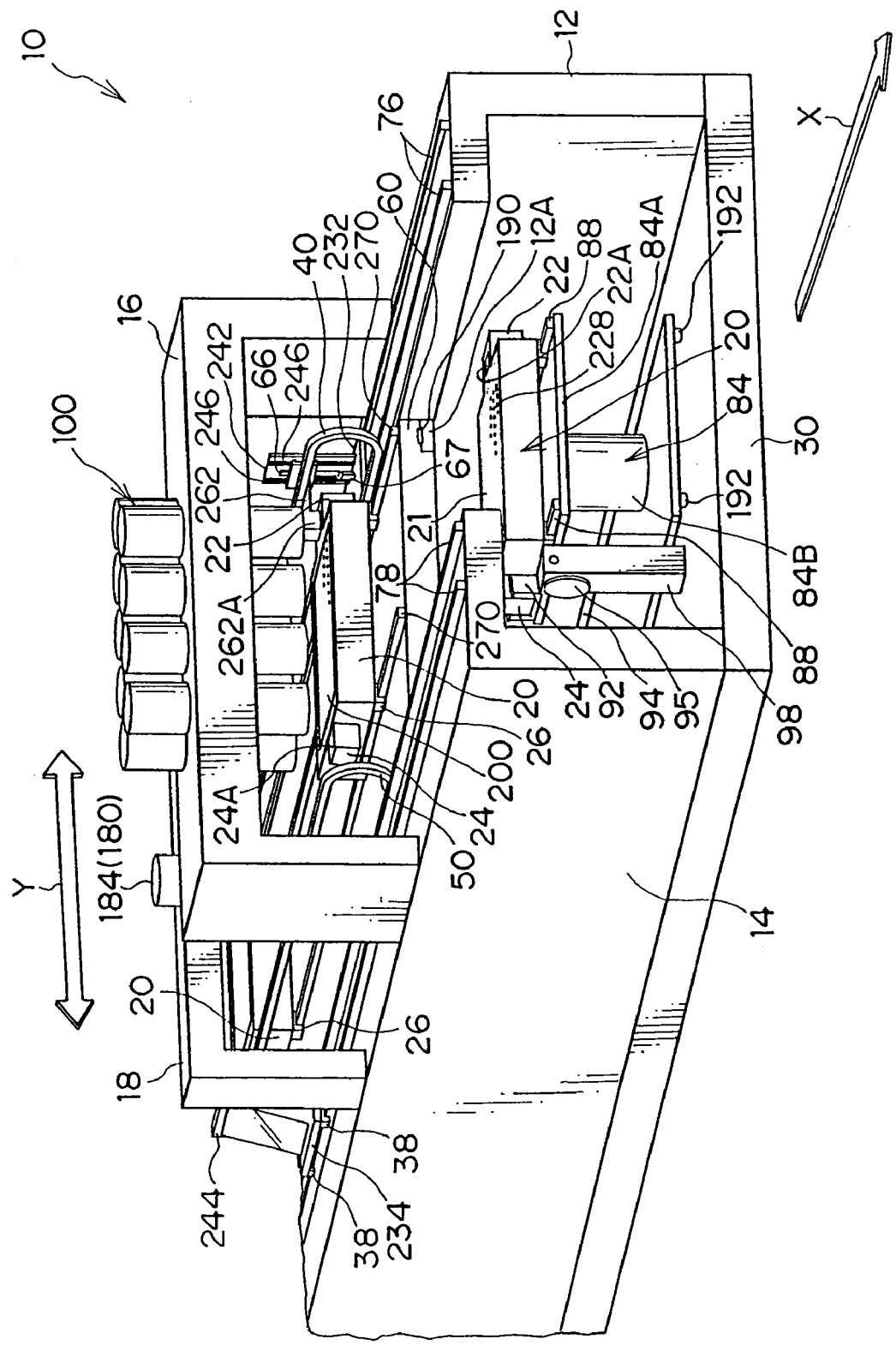
FIG. 8 is a perspective view showing the schematic configuration of the laser exposure apparatus according to a second embodiment of the invention.

It is preferable that inside end portions 66C and 68C in the conveying direction (or return direction) of the first lifting table 66A and the second lifting table 68A are located on the same line with end portions 12C and 14C (only the sidewall 12 is shown in FIG. 7) in the conveying direction (or return direction) of the overhang portions 12A and 14A when viewed in the plan view, or it is preferable that the end portions 66C and 68C are located outside the end portions 12C and 14C. Accordingly, when the first lifting table 66A and the second lifting table 68A are lifted, the first lifting table 66A and the second lifting table 68A interrupt with the overhang portions 12A and 14A, so that the cross direction of the laser exposure apparatus 10 can be shortened.

In the delivery and receipt of the stage member 20 from the upper guide rails 32 and 34 to the second changing rails 76 and 78, and in the delivery and receipt of the stage member 20 from the first changing rails 72 and 74 to the upper guide rails 32 and 34, while the second guide grooves 28 of the stage member 20 are supported by the first changing rails 72 and 74 or the second changing rails 76 and 78, the first guide grooves 26 of the stage member 20 are supported by the upper guide rails 32 and 34, so that the stage member 20 can be easily and smoothly traveled.

A belt conveyer 70 which is of lower conveying means is provided between the lower guide rails 62 and 64. The belt conveyer 70 causes the stage member 20 to return to the initial position (loading position) at a certain high speed (speed at which one stage member can be moved to the image taking position (reading position) while the other stage member is moved through the exposure unit, for example, about 1 m/s). In the belt conveyer 70, the height is restricted so that the conveying surface (upper surface) of the belt conveyer comes into close contact with the lower surface portion between the rails 29 of the stage member 20. This allows the stage member 20 to be conveyed toward the return direction along the lower guide rails 62 and 64. The lower conveying means is not limited to the belt conveyer 70, and it is possible that lower conveying means is formed any device as long as the device can move the stage member 20 at a certain speed (about 1 m/s).

Delivery devices (not shown) are arranged on the both sides of the second lift 68. The delivery device delivers the stage member 20 from the second lift 68A onto belt conveyer 70. The delivery device includes an engaging portion which engages the joint portion 22 of the stage member 20A and the joint portion 24 of the stage member 20B. When the engaging portion engages the joint portions 22 and 24 to be moved toward the return direction, the stage member 20 is delivered from the second lifting table 68A to the lower guide rails 62 and 64 and the belt conveyer 70. The configuration of the delivery device is not particularly limited. For example, it is possible that the delivery device is arranged outside in the conveying direction of the setting stage 60 and has the configuration in which the stage member 20 is pushed in to the return direction by a pushing member such as a piston rod to deliver the stage member 20 from the second lifting table 68A to the lower guide rails 62 and 64 and the belt conveyer 70.

The movement of the stage member 20 from the belt conveyer 70 to the first lifting table 66A can be realized by inertial force toward the return direction of the stage member 20 which is conveyed at a certain high speed (for example, about 1 m/s) on the belt conveyer 70. Therefore, stopping means (not shown) for stopping the stage member 20 at a predetermined position on the first lifting table 66A is provided on the first lifting table 66A. It is possible that the stopping means is formed by providing a simple stopper (not shown) such as a projection on the first changing rails 72 and 74, or it is possible that the stopping means is formed by separately providing a stopping device (not shown) having function of the stopper on the both sides of the first lift 66. The arbitrary stopping means can be adopted as long as the stopping means can cause the stage member 20 to stop at the predetermined position on the first lifting table 66A.

Similarly, it is possible to provide the delivery device (not shown) which delivers the stage member 20 onto the first lifting table 66A. In this case, it is desirable that the delivery device has the stopping function such that the stage member 20 is caused to stop at the predetermined position on the first lifting table 66A. The delivery device in this case is not also limited to one which includes the engaging portion engaging the joint portions 22 and 24. For example, it is possible that the delivery device is arranged outside in the return direction of the setting stage 60 and has the configuration in which the stage member 20 is placed onto the first lifting table 66A so as to be drawn from the belt conveyer 70.

(Operation of Exposure Apparatus)

In the laser exposure apparatus 10 having the above-described configuration, a series of operations will be described referring to FIGS. 2 to 6. At first, in the initial position (loading position), the first lifting table 66A is in a standby state at a lifted position by the first cylinder 66B. At this point, the stage member 20A is supported by the first changing rails 72 and 74 through the second guide grooves 28, and the joint portion 22 of the stage member 20 is connected to the joint portion 42B of the linear traveling body 42 on the sidewall 12.

The substrate material 200A is loaded on the load surface of the stage member 20A by a loader (substrate supplying device, not shown). At this point, since the negative pressure is supplied by the vacuum pump to the stage member 20A through the cable bearers 40A and 50A, air is sucked from the many small holes 30A made in the load surface, and the substrate material 200A is closely fixed to the load surface by the action of the air suction.

When the substrate material 200A is sucked and held on the load surface of the stage member 20A, the motor 52 is rotated by the drive pulse signal from the conveying control unit to rotate the ball screw 46. Then, the linear traveling body 42 is moved toward the conveying direction along the guide rail 56, and the stage member 20A is moved toward the conveying direction at predetermined speed while changing from the first changing rails 72 and 74 to the upper guide rails 32 and 34 through the first guide grooves 26. At this point, the cable bearer 40A passes through between the overhang portions 12A and 14A. Then, the alignment marks provided at four corners of the substrate material 200A are taken by the CCD cameras 182 and 184 vertically provided in the gate 18, and the position of the lithography area 204 of the substrate material 200A is detected.

When the alignment marks of the substrate material 200A reach the image taking position (reading position) of the CCD cameras 182 and 184, the stroboscope is caused to be emitted to take the image taking area including the alignment marks in the surface to be exposed 202 by the CCD cameras 182 and 184. The image taking information obtained by the CCD cameras 182 and 184 is outputted to the alignment control unit. The alignment control unit transforms the image taking information into the position information corresponding to the position along the scanning direction and the cross direction of the alignment mark, and the alignment control unit outputs the position information to the controller.

The controller decides the positions of the alignment marks provided according to the lithography area 204 on the basis of the position information of the alignment mark from the alignment control unit, and the controller further decides the positions along the scanning direction and the cross direction of the lithography area 204 and the amount of inclination with respect to the scanning direction of the lithography area 204 from the positions of the alignment marks. Namely, the controller decides the position of each alignment mark in the substrate material 200A and the lithography area 204 on the basis of the image information while deciding the position of the substrate material 200A on the stage member 20A.

While the controller calculates the timing of exposure start for the lithography area 204 on the basis of the position along the scanning direction of the lithography area 204, the controller executes the transformation processing for the image information corresponding to the wiring pattern to store the image information in which the transformation processing has been performed in a frame memory on the basis of the position along the cross direction of the lithography 204 and the amount of inclination with respect to the scanning direction. Contents of the transformation processing include the coordinate transformation which rotates the image information about an origin of the coordinate and the coordinate transformation which translates the image information along a coordinate axis corresponding to the cross direction. Further, if necessary, the controller performs the transformation processing which extends or compresses the amounts of extension along the cross direction and the scanning direction of the lithography area 204 and the image information corresponding to the amount of extension.

The image information after the transformation processing and the position information of the lithography area 204, which are obtained in the above-described manner, are temporarily stored in the frame memory of the controller while associated with the stage member 20A. The image information and the position information are erased from the frame memory after the substrate material 200A is delivered from the stage member 20A (from the laser exposure apparatus 10) to the conveying device (not shown) for conveying the substrate material 200A to the next process.

On the other hand, when the second guide grooves 28 of the stage member 20A disengage from the first changing rails 72 and 74 of the first lifting table 66A, the first lifting table 66A is lowered by the first cylinder 66B. The stage member 20B which has been conveyed by the belt conveyer 70 is moved to the first lifting table 66A. Namely, the stage member 20B, which has been conveyed at predetermined speed (1 m/s) on the belt conveyer 70 and the lower guide rails 62 and 64, is changed to the first lifting table 66A while caused to stop at the predetermined position by the inertial force toward the return direction and the stoppers provided on the first changing rails 72 and 74 of the first lifting table 66A. It is also possible that the stage member 20B is delivered from the belt conveyer 70 and the lower guide rails 62 and 64 from first changing rails 72 and 74 to be stopped at the predetermined position.

When the stage member 20B completely changes to the first lifting table 66A, the first lifting table 66A is lifted by the first cylinder 66B, and the joint portion 24 of the stage member 20B is connected to the joint portion 44B of the linear traveling body 44 on the sidewall 14. Similarly, the next substrate material 200B is loaded on the load surface of the stage member 20B, and the substrate material 200B is sucked and held on the loaded surface by the action of sucking the air through the small holes 30B by the negative pressure. FIG. 2 shows this state. When the substrate material 200B is sucked and held on the stage member 20B, the linear traveling body 44 is moved toward the conveying direction at predetermined speed and the stage member 20B is moved toward the conveying direction. The alignment marks of the substrate material 200B are taken by the CCD cameras 182 and 184.

On the other hand, the substrate material 200A in which the alignment marks have been taken is supplied to the exposure position of the exposure heads 100, which are vertically provided in the gate 16, in such a manner that the stage member 20A (linear traveling body 42) is further moved toward the conveying direction. While the stage member 20A is moved at predetermined speed (for example, 30 mm/s), the lithography area 204 whose position is detected by the alignment control unit on the basis of the image taken by the CCD cameras 182 and 184 is exposed on the basis of the image information according to the wiring pattern to form the latent image (image) of the wiring pattern in the lithography area 204 of the substrate material 200A.

Namely, the exposure head 100 is relatively sub-scanned toward the return direction by moving both the substrate material 200A and the stage member 20A toward the conveying direction, so that the strip-shaped exposed area 206 is sequentially formed in each of the exposure heads 100 in the substrate material 200A (see FIGS. 16, 17A, and 17B).

The exposure processing will be specifically described. At first the controller decides the position of the substrate material 200A on the stage member 20A, and the controller decides the timing when the front end of the lithography area 204 reaches the exposure position on the basis of the position information of the lithography area 204 stored in the frame memory. The controller outputs an exposure start signal to the image information processing unit in synchronization with the timing when the front end of the lithography area 204 reaches the exposure position. Therefore, the image information processing unit reads out the plurality of lines of image information stored in the frame memory to generate the control signal in each exposure head 100 on the basis of the image information read out. The mirror driving control unit controls each of the micromirrors 110 of DMD 106 in each exposure head 100 on the basis of the generated control signal so that each micromirror 110 is caused to be in ON-state or OFF-state.

When ON/OFF control of the micromirror 110 of DMD 106 is performed, DMD 106 is irradiated with the laser beam emitted from the fiber array light source 112 and the laser beam reflected from the micromirror 110 in ON-state is focused onto the surface to be exposed 202 of the substrate material 200A by the lens systems 122 and 124. Namely, in the laser beam emitted from the fiber array light source 112, the ON/OFF control is performed in each pixel, the lithography area 204 of the substrate material 200A is exposed by pixel units (exposure area) having the substantially same number as the number of pixels used in DMD 106. The image information means data in which density of each pixel constituting the image is expressed by binary (presence or absence of dot recording), and the exposure processing time by the exposure head 100 in the embodiment is set to 15 seconds.

When the exposure to the substrate material 200A on the stage member 20A is finished, the alignment marks of the substrate material 200B loaded on the stage member 20B have been already taken by the CCD cameras 182 and 184, and the stage member 20B has proceed to the process in which the position of the lithography area 204 is detected, so that subsequently the exposure to the substrate material 200B on the stage member 20B is started. Namely, when the controller completes the exposure to the lithography area 204 of the substrate material 200A, similarly the controller performs the exposure to the lithography area 204 of the next substrate material 200B on the basis of the image information after the transformation processing and the position information.

The stage member 20A in which the exposure to the substrate material 200A is finished is further conveyed toward the conveying direction by the linear traveling body 42, and the stage member 20A changes to the second changing rails 76 and 78 of the second lifting table 68A which is in the standby state at the lifted position by the second cylinder 68B from the upper guide rails 32 and 34. Namely, the stage member 20A transfers from the state in which the stage member 20A is supported through the first guide grooves 26 to the state in which the stage member 20A is supported through the second guide grooves 28. When the stage member 20A completely changes to the second lifting table 68A, i.e. when the stage member 20A comes to the unloading position of the substrate material 200A, the negative pressure supplied to the stage member 20A by the vacuum pump is released, and the substrate material (printed wiring board) 200A is removed from the load surface of the stage member 20A by the unloader (not shown). The substrate material (printed wiring board) 200A is conveyed to the next process by the conveying device (not shown).

Figure 3:
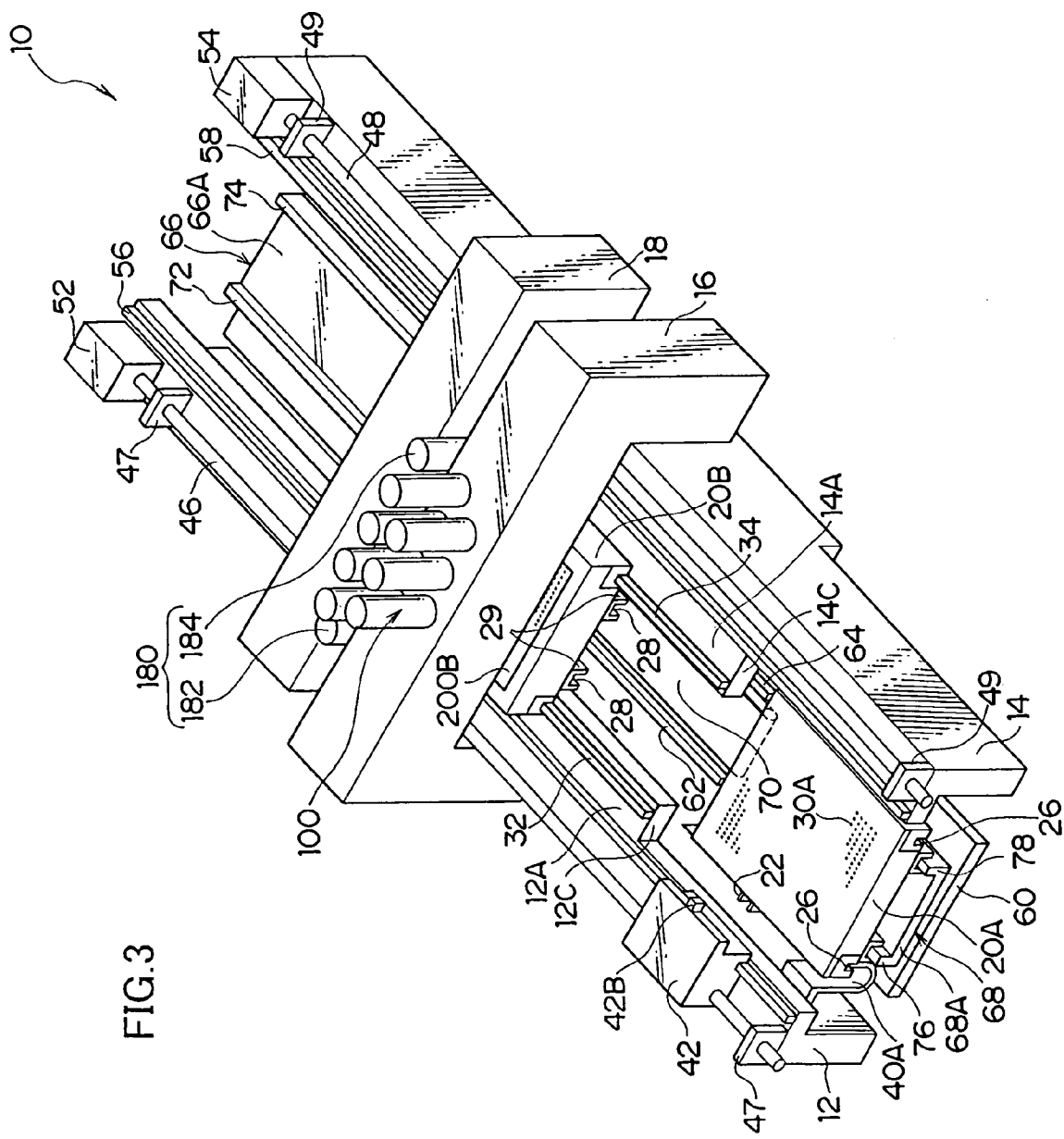
FIG. 3 is a perspective view showing the laser exposure apparatus of the first embodiment which is in a certain operating state.

The stage member 20A on the second lifting table 68A from which the substrate material 200A is removed is lowered by the second cylinder 68B, and the joint portion 22 disengages from the joint portion 42B of the linear traveling body 42. FIG. 3 shows this state. The linear traveling body 42 from which the joint portion 22 disengages returns to the original position (initial position) along the guide rail 56 at a certain high speed in such a manner that the motor 52 rotates the ball screw 46 in the direction opposite to the direction during the conveying. At this point, the linear traveling body 42 is moved on the sidewall 12 and the joint portion is not provided in the side face portion opposite to the joint portion 24 of the stage member 20B, so that the problem that the linear traveling body 42 collides with the linear traveling body 44 moved on the sidewall 14, i.e. the linear traveling body 42 collides with the stage member 20B never occurs.

In the second lifting table 68A lowered to the lowest portion with the stage member 20A loaded, the second changing rails 76 and 78 are integrally connected to the lower guide rails 62 and 64 on the setting stage 60. Namely, the end faces on the return direction of the second changing rails 76 and 78 face to the end faces on the conveying direction of the lower guide rails 62 and 64 without gap. Then, the stage member 20A is delivered from the second changing rails 76 and 78 of the second lifting table 68A to the lower guide rails 62 and 64 and the belt conveyer 70 by the delivery device (not shown).

The stage member 20A delivered to the lower guide rails 62 and 64 and the belt conveyer 70 is moved toward the return direction at high speed (for example, 1 m/s) by the belt conveyer 70, similarly to the stage member 20B, the stage member 20A is moved from the lower guide rails 62 and 64 to the first changing rails 72 and 74 of the first lifting table 66A. FIG. 4 shows this state. At this point, the cable bearer 40 is moved outside the second changing rails 76 and 78, the lower guide rails 62 and 64, and the first changing rails 72 and 74, so that the problem that the cable bearer 40 interrupts the stage member 20A never occurs.

Figure 5:
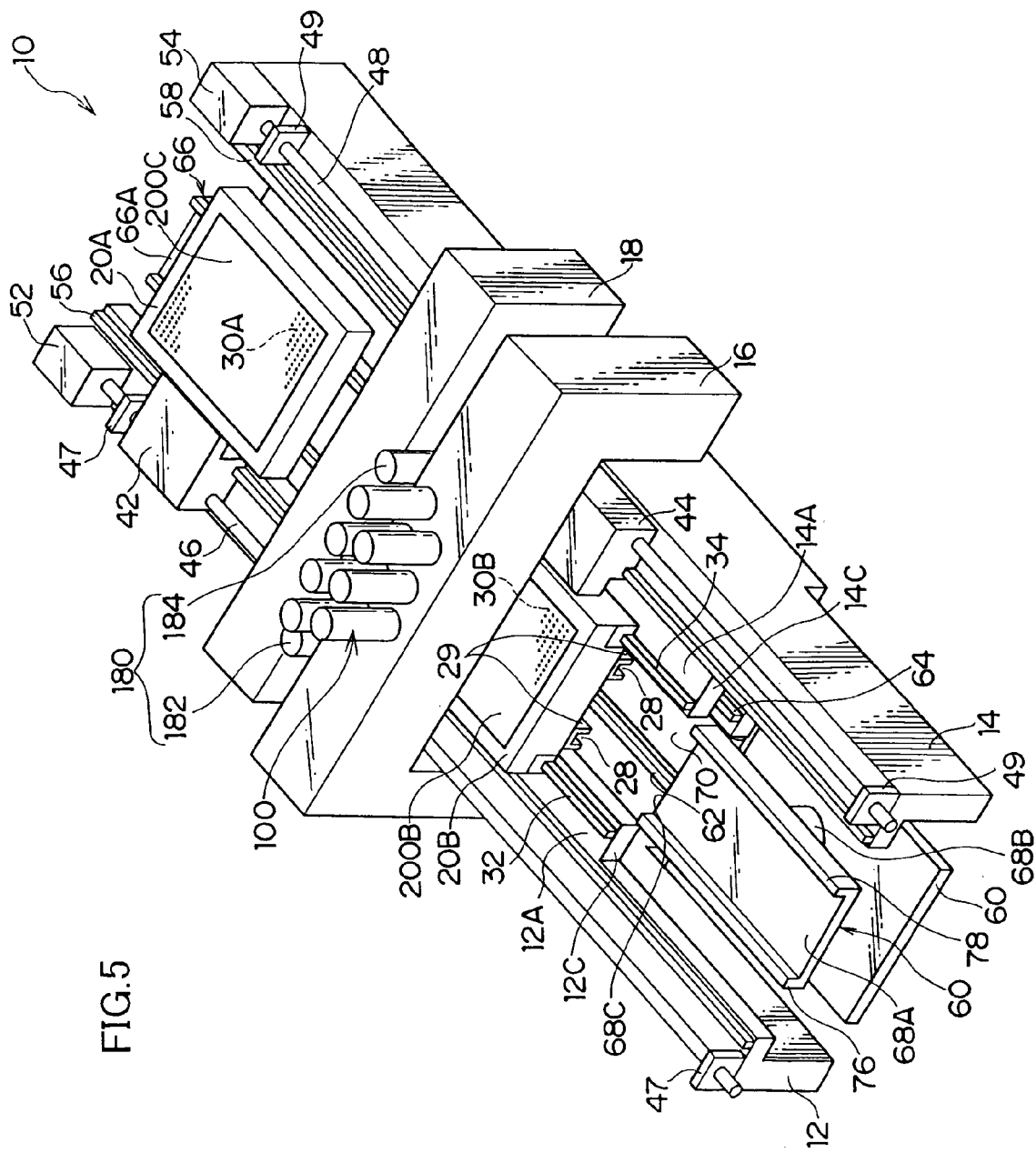
FIG. 5 is a perspective view showing the laser exposure apparatus of the first embodiment which is in still another operating state.

When the stage member 20A is completely loaded on the first lifting table 66A, the first lifting table 66A is lifted by the first cylinder 66B, and the joint portion 22 of the stage member 20A is connected to the joint portion 42B of the linear traveling body 42 which is in the standby state. Then, the next substrate material 200C is loaded on the load surface of the stage member 20A, and the substrate material 200C is sucked and held by the negative pressure. FIG. 5 shows this state.

Figure 6:
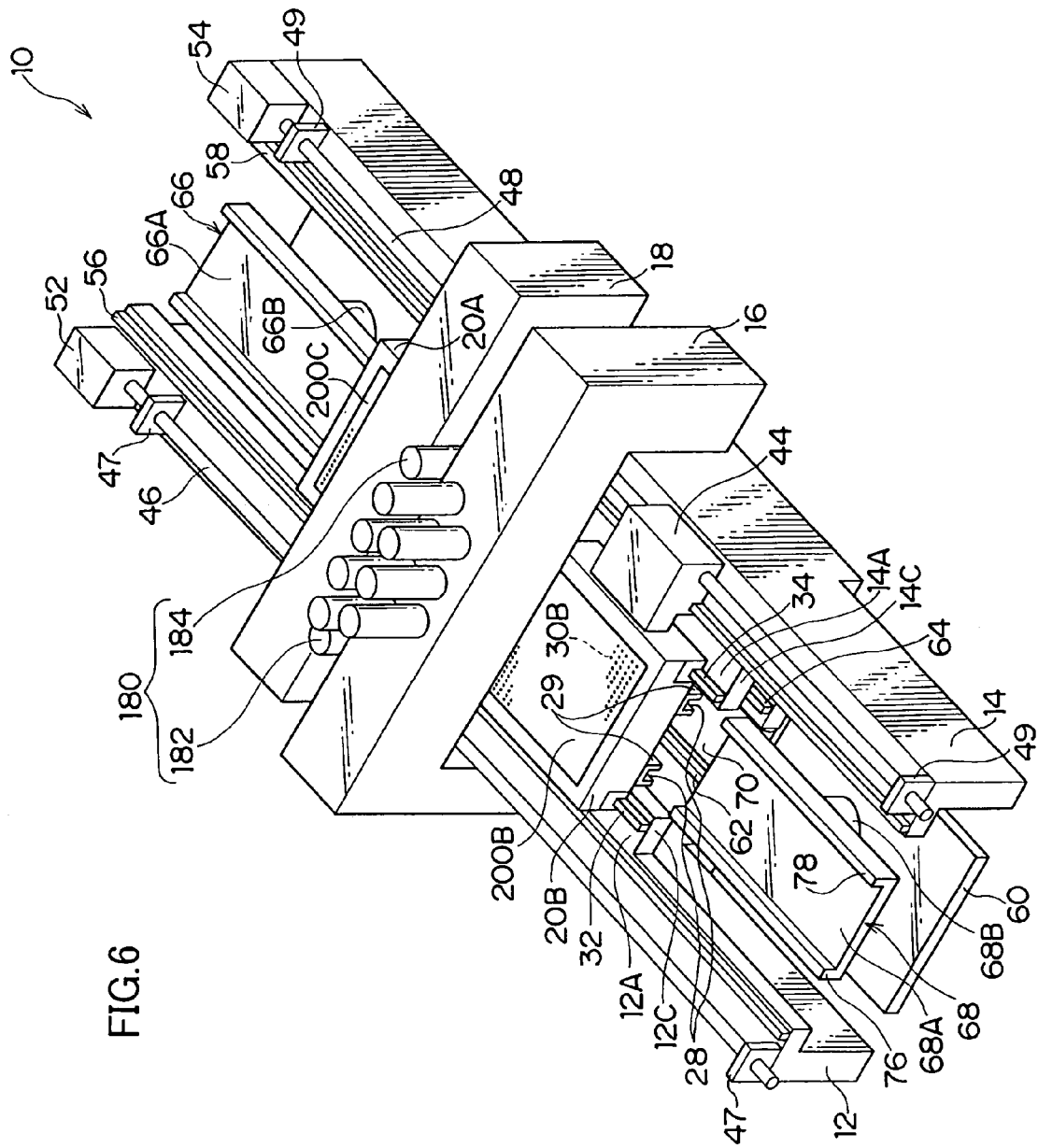
FIG. 6 is a perspective view showing the laser exposure apparatus of the first embodiment which is in another operating state.

When the substrate material 200C is sucked and held, the linear traveling body 42 is moved toward the conveying direction at predetermined speed, the alignment marks of the substrate material 200C are taken by the CCD cameras 182 and 184. FIG. 6 shows this state. The laser exposure apparatus is configured so that the process shown in FIG. 6 from the completion of the exposure to the stage member 20A is completed in about 15 seconds. Once the exposure of the substrate material 200B on the stage member 20B is finished, the exposure of the new substrate material 200C on the stage member 20A is started.

When the exposure of the substrate material 200B sucked and held on the stage member 20B is finished, similarly to the stage member 20A, the return operation is also performed by the process shown in FIG. 5 in the stage member 20B, and the new substrate material is loaded on the load surface of the stage member 20B to repeat the above-described operations. Thus, in the laser exposure apparatus 10, the exposure processing is continuously performed (almost without time interval), so that the operating rate of the exposure head 100 can be improved. Therefore, the production efficiency of the printed wiring board can be improved.

Table 1 shows the comparison of tact time when the exposure processing of one substrate material is performed in the conventional laser exposure apparatus and the laser exposure apparatus 10 of the invention. In the conventional laser exposure apparatus, one stage member performs the exposure processing while reciprocally moved (horizontally moved) at the same height (in the same plane). In the laser exposure apparatus 10 of the invention, the two stage members perform the exposure processing while performing the vertically circulating movement.

As can be seen from Table 1, in the laser exposure apparatus 10 of the invention, the time required for the exposure to one substrate material is shortened by 12 seconds compared with the conventional laser exposure apparatus. Namely, it is found that the time for producing one printed wiring board is reduced to three-fifth of the conventional method and the production efficiency is dramatically improved.

TABLE 1

| Time (sec) | Method | |
|---|---|---|
| | Stage member reciprocal movement (conventional) | Stage member Circulating movement (the invention) |
| Exposure processing | 15 | 15 |
| Substrate unload | 2 | (2): Hidden by operation of another stage member |
| Stage return | 3 | (3): Hidden by operation of another stage member |
| Substrate load | 3 | (3): Hidden by operation of another stage member |
| Finding front end for position detection | 1 | (1): Hidden by operation of another stage member |
| Substrate position detection | 6 | (3): Hidden by operation of another stage member 3: Movement time for gap between stage members |
| TOTAL | 30 | 18 |

Then, a second embodiment of the invention will be described in detail referring to FIGS. 8 to 15. The same components and the same portions as the first embodiment are indicated by the same reference number, and the overlapping description is properly neglected.

(Overview of Exposure Apparatus)

The laser exposure apparatus 10 includes at least three substantially rectangular and plate-shaped stage members 20 having the predetermined thickness (the laser exposure apparatus 10 shown in FIGS. 8 to 15 has three stage members). The stage member 20 sucks and holds the substrate material 200 onto the surface (the upper surface) of the stage member 20 while moved toward the conveying direction. The three stage members 20 have the same configuration, hereinafter, sometimes one of the three stage members 20 is referred to as stage member 20A, another is referred to as stage member 20B, and the remaining is referred to as stage member 20C. Similarly, for the substrate material 200, sometimes the substrate material sucked and held on the stage member 20A is referred to as substrate material 200A, the substrate member sucked and held on the stage member 20B is referred to as substrate material 200B, and the substrate member sucked and held on the stage member 20C is referred to as substrate material 200C.

After the three stage members 20 are moved toward the conveying direction by the later-mentioned upper conveying means 232 and 234 and stopped at a predetermined position (on the later-mentioned second lifting table 84A), the three stage members 20 are lowered, and then the three stage members 20 are moved toward the return direction by the later-mentioned lower conveying means 92. After the three stage members 20 are stopped at a predetermined position (on the later-mentioned first lifting table 82A), the three stage members 20 are lifted and moved toward the conveying direction again. Namely, the three stage members 20 are formed so as to be able to perform the vertically circulating movement in which each of the three stage members 20 is vertically moved and then moved toward the return direction and the conveying direction. When the stage member 20 is moved through the upper conveying path, the substrate material 200 sucked and held on the surface of the stage member 20 is exposed. After the substrate material 200 is removed, the stage member 20 is moved through the lower conveying path to return to the original initial position (loading position where the substrate material 200 is loaded).

A base plate 30 is arranged below the moving path (conveying path and return path) of the stage member 20. The pair of substantially L-shaped sidewalls 12 and 14 is vertically disposed on the both side in cross direction of the base plate 30 and on both sides of the moving path (conveying direction and return direction) of the stage member 20 in symmetrical relation along the moving paths. The pair of sidewalls 12 and 14 has the same configuration. For the sake of the convenience, it is assumed that the left side of the pair of sidewalls is set to the sidewall 12 and the right side of the pair of sidewalls is set to the sidewall 14 when viewed in the front elevation in the conveying direction. The two U-shaped gates 16 and 18 are provided in parallel with each other so as to straddle the moving path of the stage member 20 while separated from each other with the predetermined interval in the substantially central portions in the length direction of the sidewalls 12 and 14. The gates 16 and 18 are separated from each other at the distance more than the length along the conveying direction of the stage member 20.

Both lower portions of the gates 16 and 18 are fixed to the upper surfaces of the sidewalls 12 and 14 respectively. The plurality of exposure heads 100 is attached to the upper portion of the gate 16 located on the downstream side, and two CCD cameras 182 and 184 constituting the image position detector 180 are attached to the upper portion of the gate 18 on the upstream side. The exposure heads 100 are fixed downward so that the exposure heads 100 can irradiate the substrate material 200 passing through the gate 16 (image forming unit) with the laser beam B. The CCD cameras 182 and 184 are also fixed downward so as to be able to take the image of the alignment mark for the position (lithography area) detection of the substrate material 200 passing through the gate 18 (image position detector).

The laser exposure apparatus 10 is mainly operated as follows. The substrate material 200A is conveyed while sucked and held on the stage member 20A, and the CCD cameras 182 and 184 take the image of the alignment mark to detect the position (lithography area) of the substrate material 200A. The predetermined lithography area is exposed by the exposure heads 100 on the basis on the detection result. When the exposure is finished, the substrate material (printed wiring board) 200A is unloaded from the stage member 20A. On the other hand, at the time when the substrate material 200A is removed from the stage member 20A, the stage member 20B is already conveyed while sucking and holding the next substrate material 200B, and the CCD cameras 182 and 184 perform the position detection to start the exposure. Further, the stage member 20C also sucks and holds the second next substrate material 200C, and the stage member 20C is caused to be in the standby state for conveying the substrate material 200C to the position detection by the CCD cameras 182 and 184.

Namely, the stage member 20B from which the substrate material (printed wiring board) is unloaded is moved through the lower portion of the stage member 20A to return to the initial position (loading position) while the substrate material 200A on the stage member 20A is exposed, and the next substrate material 200B is loaded to proceed to the process in which the position detection is performed by the CCD cameras 182 and 184. Further, the stage member 20C from which the substrate material (printed wiring board) is unloaded is also moved through the lower portion of the stage member 20A to return to the initial position (loading position) while the substrate material 200A on the stage member 20A is exposed, and the stage member 20C proceeds to the process in which the second next substrate material 200C is loaded.

In the laser exposure apparatus 10, the position detection and the exposure of the substrate material 200 are sequentially and continuously performed by the vertical circulating movement of each of the stage members 20A, 20B, and 20C, so that the operating rate of the exposure head 100, i.e. the production efficiency of the printed wiring board is improved.

(Configurations of Stage Member and Vertically Circulating Means)

Then, the configurations of the stage member 20 and the vertically circulating means will be described in detail referring to FIGS. 8 to 15. For the sake of convenience, in the case the stage member 20 is described by distinguishing among the stage member 20A, the stage member 20B, and the stage member 20C, in accordance with the distinction between the stage members 20A, 20B, and 20C, sometimes the same constituents in the stage members 20A, 20B, and 20C are distinguished by marking the constituents with the alphabetic characters of A, B, and C. As described above, the stage member 20 is formed in the substantially rectangular plate shape having the predetermined thickness, and the inside of the stage member 20 is a cavity. The upper face (surface) is formed to be the plane load surface (stage surface) 21 so that the substrate material 200 is loaded, many air suction small holes 228 for sucking the substrate material 200 by the negative pressure are made in the load surface.

In the stage member 20, the joint portions 22 and 24 to which the joint portions 262 and 264 of the linear traveling bodies 232 and 234 described later are connected are integrally provided on both the side face portions opposite to the sidewalls 12 and 14 while protruded from the side face. The joint portions 22 and 24 is formed in a cylinder having hole portion 22A and 24A which has the rectangular shape when viewed in the plan view, and a terminal (not shown) connected to the power line or the piping (not shown) with a check valve communicated with the air piping is provided in the inner surface (in the hole portions 22A and 24A) on the stage member 20 side in the joint portions 22 and 24. The rails 26 parallel to the conveying direction are integrally provided near the corner angle portion of the lower surface of the stage member 20 while protruded, the reversely U-shaped guide grooves 26A are formed in the rails 26 respectively.

On the other hand, in the upper surface of the sidewall 12, a ball screw 72 having the predetermined length is provided in parallel with the conveying direction (return direction). A pair of guide rails 76 is provided throughout the total length of the sidewall 12 on the both sides of the ball screw 72. Similarly, in the upper surface of the sidewall 14, a ball screw 74 having the predetermined length is provided in parallel with the conveying direction (return direction). A pair of guide rails 78 is provided throughout the total length of the sidewall 14 on the both sides of the ball screw 74. Motors 73 and 75 which can be normally and reversely rotated are attached to the end portions of the upstream sides (or downstream sides) of the ball screws 72 and 74 respectively. The motors 73 and 75 are configured to be rotated by the drive pulse signal outputted from the conveying control unit (not shown), and the conveying control unit is connected to the controller.

The neighborhoods of both end portions of the ball screws 72 and 74 are supported by a pairs of support portions (not shown). In the ball screws 72 and 74 between the support portions, the linear traveling bodies 232 and 234 which are of the upper conveying means for conveying the stage members 20A, 20B, and 20C are supported while can be moved in the conveying direction and the return direction. Namely, cylindrical members 232A and 234A which have the thread inside the cylindrical member (see FIG. 13) are integrally provided on the lower surface side of the linear traveling bodies 232 and 234, and the ball screws 72 and 74 are inserted through the linear traveling bodies 232 and 234 while threaded in the cylindrical members 232A and 234A.

In the proximity of the corner angle portions of the lower surface of the linear traveling bodies 232 and 234, rails 36 and 38 parallel to the conveying direction are integrally provided while protruded. Substantially U-shaped guide grooves 36A and 38A are formed in the rails 36 and 38 respectively, and the guide grooves 36A and 38A are slidably fitted to guide rails 76 and 78. When the motor 73 and 75 are driven by the drive pulse signal to rotate normally and reversely the ball screws 72 and 74, the linear traveling bodies 232 and 234 can travel in the conveying direction and the return direction along the guide rails 76 and 78 at predetermined speed (for example, at low speed of 30 mm/s in exposure).

In the upper surface of the linear traveling bodies 232 and 234, guide walls 242 and 244 are vertically provided while integrated with the linear traveling bodies 232 and 234 respectively. The guide walls 242 and 244 are long in the vertical direction. In the inner surface (surface opposite to the stage member 20) of the guide walls 242 and 244, a pair of guide rails 246 and 248 is provided throughout the substantially total length of the guide walls 242 and 244 while protruded. The guide rails 246 and 248 are vertically paired, and the guide rails 246 and 248 are integrated with the guide walls 242 and 244. Support plates 52 and 54 are provided on the inner surface side of the guide walls 242 and 244. The support plates 52 and 54 are formed while being vertically movable. Rails 56 and 58 are integrally provided while protruded in the outer surface (surface not opposite to the stage member 20) of the support plates 52 and 54 and at four corners of the support plates 52 and 54. The rails 56 and 58 are long in the vertical direction. Substantially reversely U-shaped guide grooves 56A and 58A slidably fitted to the guide rails 246 and 248 are formed in the rails 56 and 58 respectively.

Figure 13:
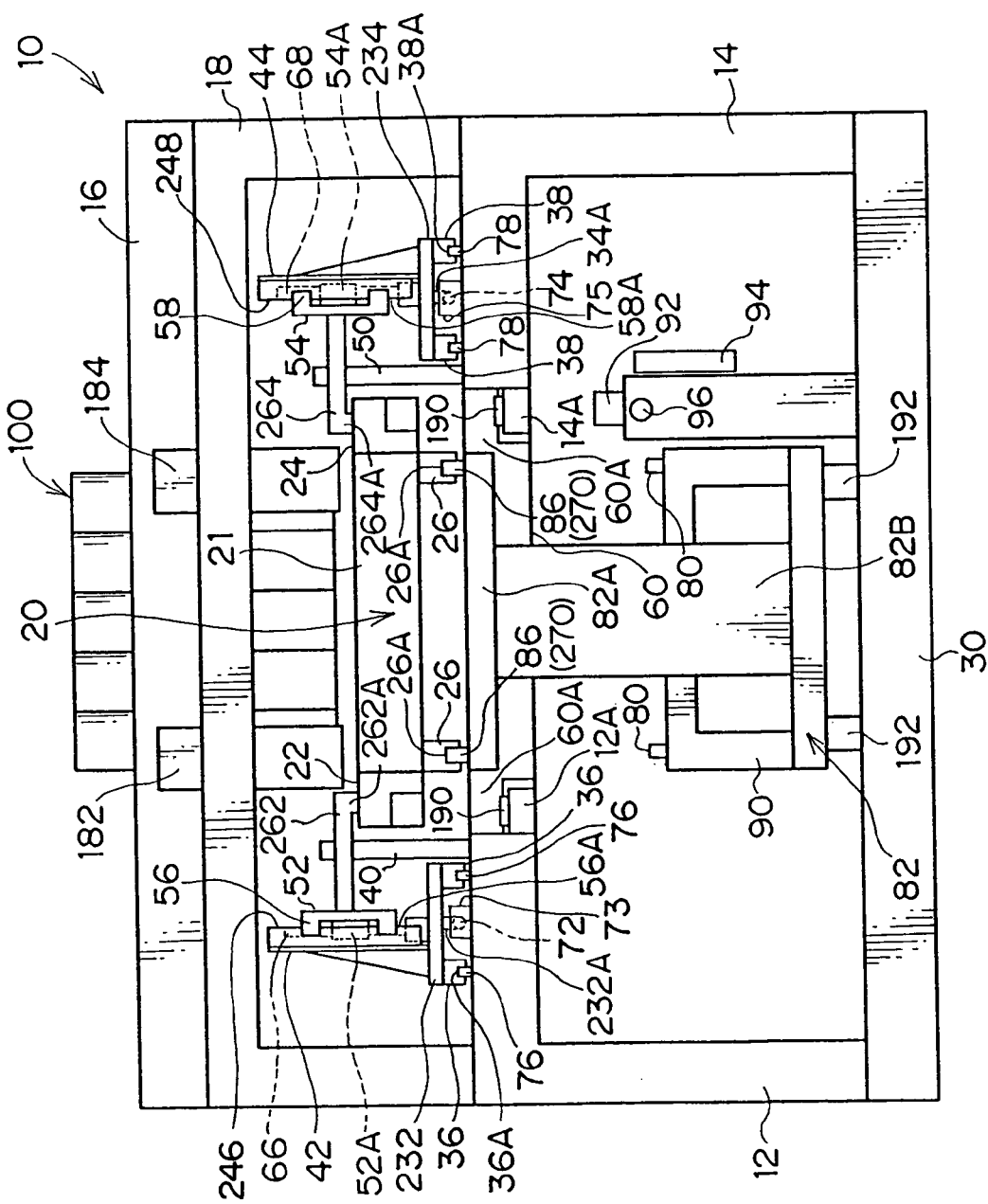
FIG. 13 is a cross-sectional view of the laser exposure apparatus of the second embodiment.
Figure 15:
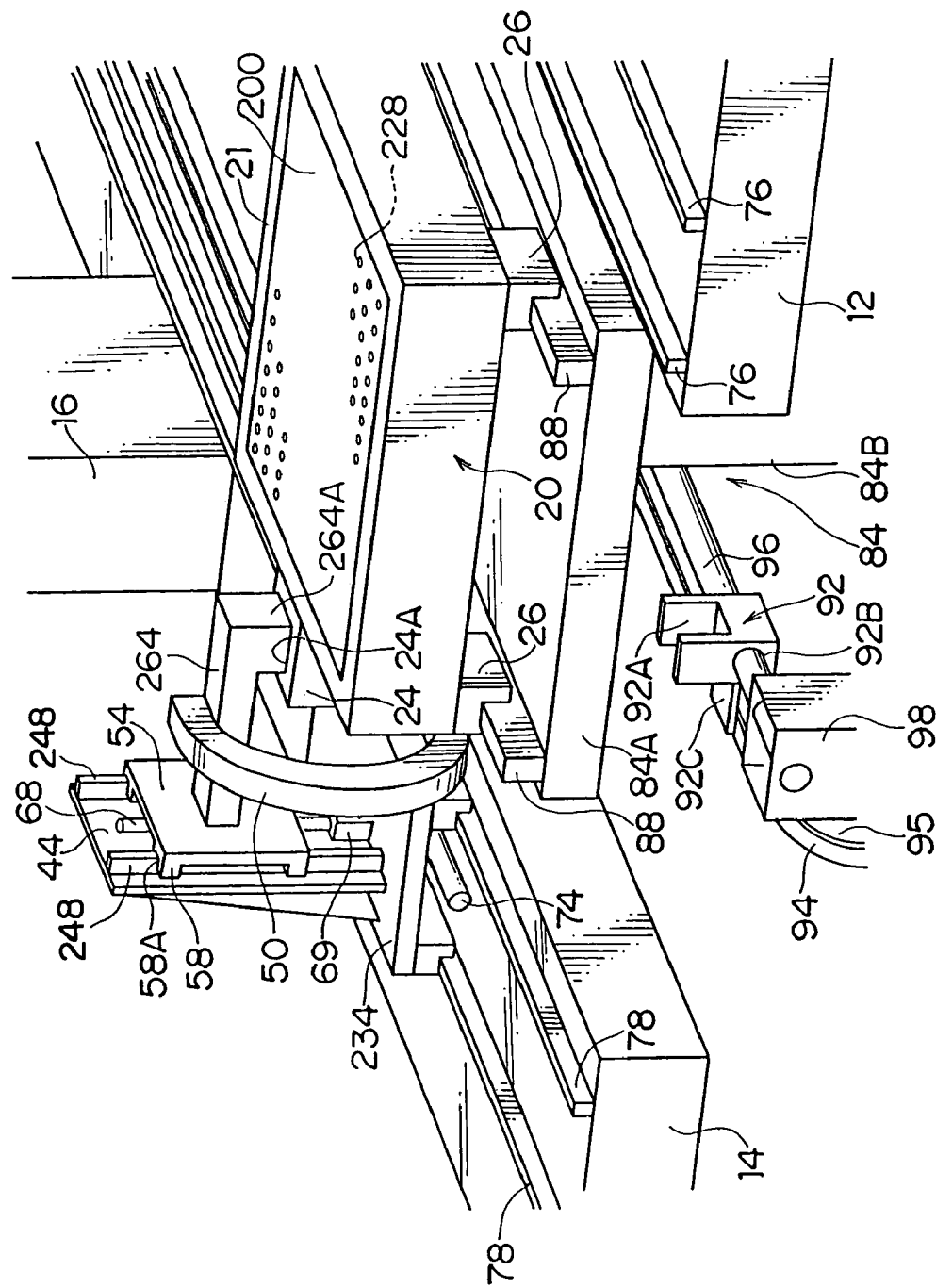
FIG. 15 is a perspective view showing an essential part of the laser exposure apparatus of the second embodiment in which a stage is located at a recording medium unloading position.

As shown in FIGS. 13 and 15, ball screws 66 and 68 are provided between the pair of guide rails 246 and 248. Cylindrical members 52A and 54A which have the thread inside the cylindrical member 52A and 54A are integrally provided in the center on the outer surface of the support plates 52 and 54, and the ball screws 66 and 68 are inserted through the cylindrical member 52A and 54A while threaded in the cylindrical member 52A and 54A. Motors 67 and 69 which can normally and reversely rotate the ball screws 66 and 68 are attached to the lower end portions (linear traveling bodies 232, 234) of the guide walls 242 and 244 respectively. Therefore, similarly, the motors 67 and 69 are driven by the drive pulse signal to rotate normally or reversely the ball screws 66 and 68, which allows the support plates 52 and 54 to be vertically moved along the guide rails 246 and 248.

In the substantial center of the inner surface (surface opposite to the stage member 20) of the support plates 52 and 54, joint portions 262 and 264 connected to the joint portions 22 and 24 of the stage member 20 are integrally provided while protruded. The joint portions 262 and 264 are formed in the substantial L-shape in which front end portions 262A and 264A inserted into the hole portions 22A and 24A are bent downward at an angle of 90°, and the front end portions 262A and 264A are formed in a square rod shape so that the shapes of the front end portions 262A and 264A correspond to the shapes of the hole portions 22A and 24A. The shape of the hole portions 22A and 24A is not limited to the shape shown in the drawings. When the design change of the shape of the hole portions 22A and 24A is performed, the design of the shape of the front end portions 262A and 264A is also properly changed.

The front end portions 262A and 264A are detachably connected to the hole portions 22A and 24A by inserting the front end portions 262A and 264A into the hole portions 22A and 24A of the joint portions 22 and 24 from above. Namely, by lifting and lowering the support plates 52 and 54, the front end portions 262A and 264A and the hole portions 22A and 24A are connected, or the front end portions 262A and 264A and the hole portions 22A and 24A are disconnected. The joint portions 262 and 264 and the joint portions 22 and 24 are vertically detachable. However, the joint portions 262 and 264 and the joint portions 22 and 24 are not horizontally detachable. Therefore, since the linear traveling bodies 232 and 234 pull and move the stage member 20 toward the conveying direction which is of the horizontal direction, it is not necessary to provide the automotive mechanism in the stage member 20, and the configuration of the stage member 20 can be simplified.

As mentioned later, when the linear traveling bodies 232 and 234 in which the connection to the stage member is released is moved toward the return direction, the support plates 52 and 54 are lifted to retract the joint portions 262 and 264 to the upper portion so that the joint portions 22 and 24 of the stage member 20 interrupt the joint portions 262 and 264. Further, as mentioned later, even if the stage member 20 is lifted, because the joint portions 262 and 264 are located above the joint portions 22 and 24, the joint portions 262 and 264 never interrupts the stage member 20.

The joint portions 262 and 264 are connected to the cable bearers 40 and 50 which include the power line or the air piping for generating the negative pressure in the stage member 20. In the case where the stage member 20 includes the vacuum generation device (not shown) such as the vacuum pump for air suction, the cable bearers 40 and 50 become the cable bearer including the power line for driving the vacuum generation device. In the case where the stage member 20 does not include the vacuum generation device, the cable bearers 40 and 50 become the cable bearer including the air piping connected to the vacuum generation device, such as a vacuum pump, which is separately placed.

Each of the cable bearers 40 and 50 is formed by the flexible tube so as to be able to be deformed by following the movements of the linear traveling bodies 232 and 234, and the cable bearers 40 and 50 are arranged along the upper surfaces of the sidewalls 12 and 14 respectively. The front end portions of the cable bearers 40 and 50 are connected to the joint portions 262 and 264 of the linear traveling bodies 232 and 234 so as to be rounded upward from the downstream side (or upstream side) (see FIG. 15). When the linear traveling bodies 232 and 234 are moved along the guide rails 76 and 78, the cable bearers 40 and 50 become the state in which the intermediate portion of the cable bearers 40 and 50 are bent in the circular arc to follow the linear traveling bodies 232 and 234. Therefore, the cable bearers 40 and 50 are not entangled or the cable bearers 40 and 50 never interrupt the movement of the linear traveling bodies 232 and 234.

In the case where the cable bearers 40 and 50 are the power lines, in the joint portions 262 and 264 connected to the cable bearers 40 and 50, the power line is internally provided, and connecting terminals (not shown) are attached to the front end portions 262A and 264A respectively. In this case, the terminals (not shown) connected to the connecting terminals (plug) are provided in the inner surfaces on the stage member 20 side of the hole portions 22A and 24A of the joint portions 22 and 24 respectively. On the other hand, in the case where the cable bearers 40 and 50 are the air piping, the air pipes communicated with the air pipes of the cable bearers 40 and 50 are internally provided or formed in the joint portions 262 and 264, and connecting pipes (not shown) having apertures are attached to the front end portions 262A and 264A respectively. In this case, the pipes (not shown) with the check valves including the apertures connected to the connecting pipes are provided in the inner surfaces on the stage member 20 sides of the hole portions 22A and 24A respectively.

The reason why the pipes provided in the both side portions of the stage member 20 are formed by the pipes with the check valves is that, when the joint portions 262 and 264 of the linear traveling bodies 232 and 234 are connected to one of the joint portions 22 and 24, the air is prevented from sucking from the inside (piping) of the other one of hole portions 22A and 24A in the joint portions 22 and 24, i.e. the suction force from the small holes 228 is not reduced. In the cable bearers 40 and 50, it is possible to provide both the power line and the air piping. In this case, the power line can be utilized as the driving power of the motors 67 and 69.

Figure 14:
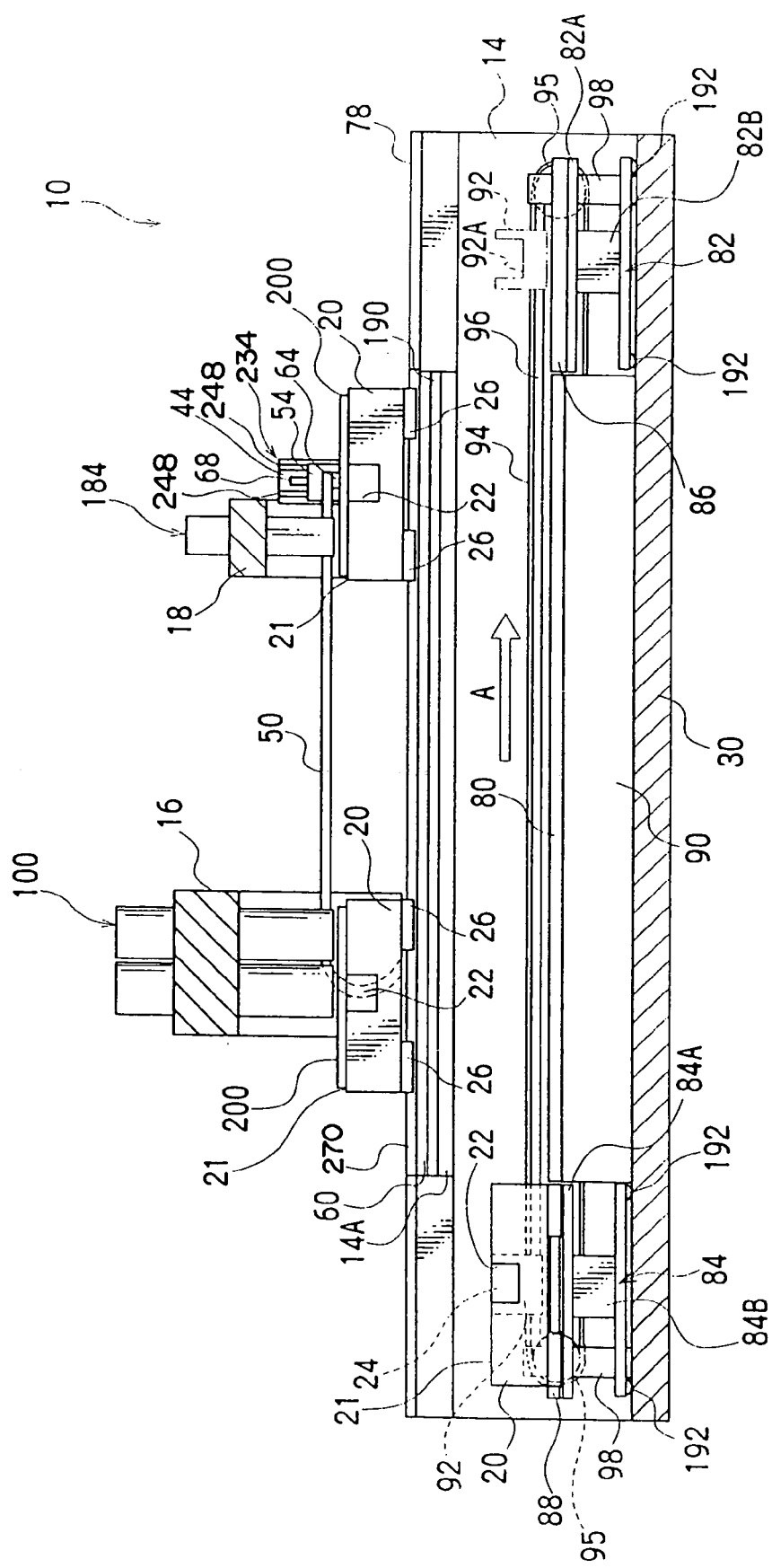
FIG. 14 is a length sectional view showing the laser exposure apparatus of the second embodiment.

As shown in FIGS. 13 and 14, in the upper centers of the sidewalls 12 and 14 and on the side of the end faces opposite to each other, step portions 12A and 14A whose lower sides overhang inside are formed while having the predetermined length and the predetermined width. Vibration absorption members 190 are provided on the step portions 12A and 14A. Any material can be used as the vibration absorption member 190 as long as the material is made of the elastic body which can suppress the vibration. For example, a rubber vibration isolator is adopted. Both end step portions 60A are supported by the vibration absorption members 190, and a support stage 60 is bridged between the sidewalls 12 and 14.

On the support stage 60, a pair of upper guide rails 270 is integrally provided throughout the total length in the longitudinal direction (conveying direction) of the support stage 60 while protruded, and the upper guide rails 270 are adapted to be slidably fitted to guide grooves 26A formed in the rails 26 protruded toward the lower surface of the stage member 20. The setting stage 90 having the same length as the support stage 60 is arranged on the base plate 30 and below the support stage 60. On the setting stage 90, a pair of lower guide rails 80 having the same interval (track width) as the upper guide rails 270 is integrally provided throughout the total length of the setting stage 90 while protruded.

In the laser exposure apparatus of the second embodiment, it is difficult to propagate the vibration to at least the stage member 20 which is moved along the upper guide rails 270. Namely, since the support stage 60 including the upper guide rails 270 are supported through the vibration absorption members 190, it is difficult to propagate the vibration from the sidewalls 12 and 14. Further, since the upper guide rails 270 and the lower guide rails 80 are independently provided, the stage member 20C moved along the lower guide rails 80 is difficult to propagate the vibration to the stage members 20A and 20B moved along the upper guide rails 270. Therefore, position shift (quality defect) is not generated in the alignment processing of the substrate material 200, or defect is not generated in image quality during the exposure processing.

A first lift 82 and a second lift 84 which lift and lower the stage member 20 are arranged on the upstream side and downstream side of the setting stage 90 respectively. The first lift 82 and the second lift 84 having the same configurations include a first cylinder 82B and a second cylinder 84B which are vertically moved within the predetermined height by the oil pressure or the like. A first lifting table 82A and a second lifting table 84A are horizontally attached to the upper portions of the first cylinder 82B and the second cylinder 84B in an integral manner. The first lifting table 82A and the second lifting table 84A having the rectangular plate shapes are long in the conveying direction (return direction). A pair of first changing rails 86 and a pair of second changing rails 88 are provided on the first lifting table 82A and a second lifting table 84A while protruded respectively. The first changing rails 86 and the second changing rails 88 have the same intervals (track width) as the lower guide rails 80.

The length in the conveying direction of the first lifting table 82A and the second lifting table 84A is determined in consideration of the length in the conveying direction of the substrate material 200, and also considering that the first changing rails 86 and second changing rails 88 are continuously and integrally connected to the upper guide rails 270 when the first lifting table 82A and the second lifting table 84A are lifted and the first changing rails 86 and second changing rails 88 are continuously and integrally connected to the lower guide rails 80 when the first lifting table 82A and the second lifting table 84A are lowered. When the first changing rails 86 and the second changing rails 88 are continuously and integrally connected to the upper guide rails 270 and the lower guide rails 80, the delivery and receipt of the stage member 20 to the upper guide rails 270 and the lower guide rails 80 can be easily and smoothly performed.

It is desirable that both the first lift 82 and the second lift 84 are also placed on the setting stage 90 through vibration absorption members 192. In this case, the vibration in the vertical movement of the first lifting table 82A and the second lifting table 84A can be suppressed. As a result, it is difficult to propagate the vibration to the stage member 20 moved along the upper guide rails 270.

As shown in FIGS. 13 to 15, a linear traveling body 92 which is of the lower conveying means and a chain or timing belt 94 are arranged on one side of the setting stage 90 (on the side of the sidewall 14 or on the side of the sidewall 12). The linear traveling body 92 causes the stage member 20 to return to the initial position (loading position) at a certain high speed (speed at which one stage member can be moved to the image taking position (reading position) or the loading position while another stage member is moved through the exposure unit, for example, about 1 m/s). The chain or timing belt 94 reciprocally moves the linear traveling body 92 along the return direction (conveying direction).

The linear traveling body 92 is formed in the substantial U-shape when viewed in the side view, a rod 96 is inserted with play into a hole portion 92B made in the lower portion of the linear traveling body 92. The rod 96 is supported by a pair of support posts 98 which are vertically provided near the end portion on the upstream side and near the end portion on the downstream side of the base plate 30 respectively. Each pulley 95 is journaled in the support post 98. The motor (not shown) is provided in one of the support posts 98, which rotates the pulley 95.

The timing belt 94 is entrained about the pair of pulleys 95, and an attaching plate 92C extending from the outer surface (surface opposite to the sidewall 14) of the linear traveling body 92 is attached to the timing belt 94. Therefore, the linear traveling body 92 is slidable to the rod 96, and the linear traveling body 92 is movably supported while integrated with the timing belt 94. Further, a joint portion 92A fitted to the joint portion 24 is formed in the linear traveling body 92. The joint portion 92A is a concave part of the linear traveling body 92 formed in the U-shape, and the shape of the joint portion 92A (shape of the concave part) corresponds to the outer shape of the joint portion 24.

When the stage member 20 is lowered by the second lift 84, the joint portion 24 is fitted to the joint portion 92A of the linear traveling body 92. When the joint portion 24 and the joint portion 92A are fitted to each other, the pulley 95 is rotated to move the timing belt 94 toward the direction of an arrow A shown in FIG. 14, which allows the stage member 20 to be conveyed from the second lifting table 84A to the first lifting table 82A (from the unloading position to the loading position) along the second changing rails 88, the lower guide rails 80, and the first changing rails 86. The lower conveying means is not limited to the above-described configuration. The arbitrary lower conveying means can be adopted as long as the lower conveying means can move the stage member 20 at a certain high speed (1 m/s).

(Operation of Exposure Apparatus)

In the laser exposure apparatus 10 having the above-described configuration, a series of operations will be described referring to FIGS. 9 to 12. At first, in the initial position (loading position), the first lifting table 82A is in the standby state at the lifted position by the first cylinder 82B. At this point, the stage member 20A is supported by the first changing rails 86 through the guide grooves 26A, and the first changing rails 86 is integrally connected to the upper guide rails 270. Namely, the end faces on the conveying direction side of the first changing rails 86 face to the end faces on the return direction side of the upper guide rails 270 without gap.

The substrate material 200A is loaded on the load surface 21A of the stage member 20A by the loader (substrate supplying device, not shown). At this point, the negative pressure is supplied by the vacuum pump to the stage member 20A through the cable bearers 50 and the joint portion 264, and the air is sucked from the many small holes 228A made in the load surface 21A, so that the substrate material 200A is closely fixed to the load surface 21A by the action of the air suction. Then, the hole portion 24A of the joint portion 24 of the stage member 20A is connected to the joint portion 264 of the linear traveling body 234 on the sidewall 14 in such a manner that the front end portion 264A of the joint portion 264 is inserted into the hole portion 24A of the joint portion 24 by lowering the support plate 54.

When the substrate material 200A is sucked and held on the load surface 21A of the stage member 20A and the joint portion 264 of the linear traveling body 234 is connected to the joint portion 24, the motor 75 is rotated by the drive pulse signal from the conveying control unit to rotate the ball screw 74. Then, the linear traveling body 234 is moved toward the conveying direction along the guide rails 78, and the stage member 20A is moved toward the conveying direction at predetermined speed while smoothly changing from the first changing rails 86 to the upper guide rails 270. The alignment marks provided at four corners of the substrate material 200A are taken by the CCD cameras 182 and 184 vertically provided in the gate 18, and the position of the lithography area 204 of the substrate material 200A is detected.

The controller decides the positions of the alignment marks provided according to the lithography area 204 on the basis of the position information concerning the alignment mark from the alignment control unit, and the controller further decides the positions along the scanning direction and the cross direction of the lithography area 204 and the amount of inclination with respect to the scanning direction of the lithography area 204 from the positions of the alignment marks.

While the controller calculates the timing of exposure start for the lithography area 204 on the basis of the position along the scanning direction of the lithography area 204, the controller executes the transformation processing for the image information corresponding to the wiring pattern to store the image information in which the transformation processing has been performed in the frame memory on the basis of the position along the cross direction of the lithography 204 and the amount of inclination with respect to the scanning direction.

The image information after the transformation processing and the position information of the lithography area 204, which are obtained in the above-described manner, are temporarily stored in the frame memory of the controller while associated with the stage member 20A. The image information and the position information are erased from the frame memory after the substrate material 200A is delivered from the stage member 20A (form the laser exposure apparatus 10) to the conveying device (not shown) for conveying the substrate material 200A to the next process.

The substrate material 200A in which the alignment marks have been taken is supplied to the exposure position of the exposure heads 100, which are vertically provided in the gate 16, in such a manner that the stage member 20A (linear traveling body 234) is further moved toward the conveying direction. While the stage member 20A is moved at predetermined speed (for example, 30 mm/s), the lithography area 204 whose position is detected by the alignment control unit on the basis of the image taken by the CCD cameras 182 and 184 is exposed on the basis of the image information according to the wiring pattern to form the latent image (image) of the wiring pattern in the lithography area 204 of the substrate material 200A. Namely, the exposure heads 100 are relatively sub-scanned toward the return direction by moving both the substrate material 200A and the stage member 20A toward the conveying direction, so that the strip-shaped exposed area 206 is sequentially formed in each of the exposure heads 100 in the substrate material 200A (see FIGS. 9 and 10).

The support stage 60 from which the upper guide rails 270 are protruded are supported by the sidewalls 12 and 14 through the vibration absorption members 190, and the first lift 82 and the second lift 84 are also arranged in the setting stage 90 through the vibration absorption members 192, so that it is difficult to propagate the vibration to the stage member 20A when the stage member 20A is moved on the upper guide rails 270. Therefore, the defect in image quality is not generated.

On the other hand, when the guide grooves 26A of the stage member 20A disengage from the first changing rails 86 of the first lifting table 82A, the first lifting table 82A is lowered by the first cylinder 82B. The stage member 20B which has been conveyed at predetermined speed (1 m/s) by the linear traveling body 92 is moved to the first lifting table 82A. Namely, while the stage member 20B is changed from the lower guide rails 80 to the first lifting table 82A, the stage member 20B is caused to stop at the predetermined position.

When the stage member 20B completely changes to the first lifting table 82A, the first lifting table 82A is lifted by the first cylinder 82B. Similarly, the next substrate material 200B is loaded on the load surface 21B of the stage member 20B, and the substrate material 200B is sucked and held on the loaded surface 21B by the action of sucking the air through the small holes 228B by the negative pressure.

When the substrate material 200B is sucked and held on the stage member 20B, the support plate 52 of the linear traveling body 232 on the sidewall 12 is lowered to connect the joint portion 22 of the stage member 20B and the joint portion 262 by inserting the front end portion 262A of the joint portion 262 into the hole portion 22A of the joint portion 22. Similarly, the motor 73 is rotated by the drive pulse signal from the conveying control unit to rotate the ball screw 72. This allows the linear traveling body 232 to be moved toward the conveying direction along the guide rails 76. The stage member 20B is moved toward the conveying direction (from the first changing rails 86 to the upper guide rails 270) at predetermined speed, and the alignment marks of the substrate material 200B are taken by the CCD cameras 182 and 184.

When the guide grooves 26A of the stage member 20B disengage from the first changing rails 86 of the first lifting table 82A, the first lifting table 82A is lowered by the first cylinder 82B. The stage member 20C which has been conveyed at predetermined speed (1 m/s) by the linear traveling body 92 is moved to the first lifting table 82A. Namely, while the stage member 20C is changed from the lower guide rails 80 to the first lifting table 82A, the stage member 20C is caused to stop at the predetermined position.

When the stage member 20C completely changes to the first lifting table 82A, the first lifting table 82A is lifted by the first cylinder 82B. Similarly, the next substrate material 200C is loaded on the load surface 21C of the stage member 20C, and the substrate material 200C is sucked and held on the loaded surface 21C by the action of sucking the air through the small holes 228C by the negative pressure.

Figure 9:
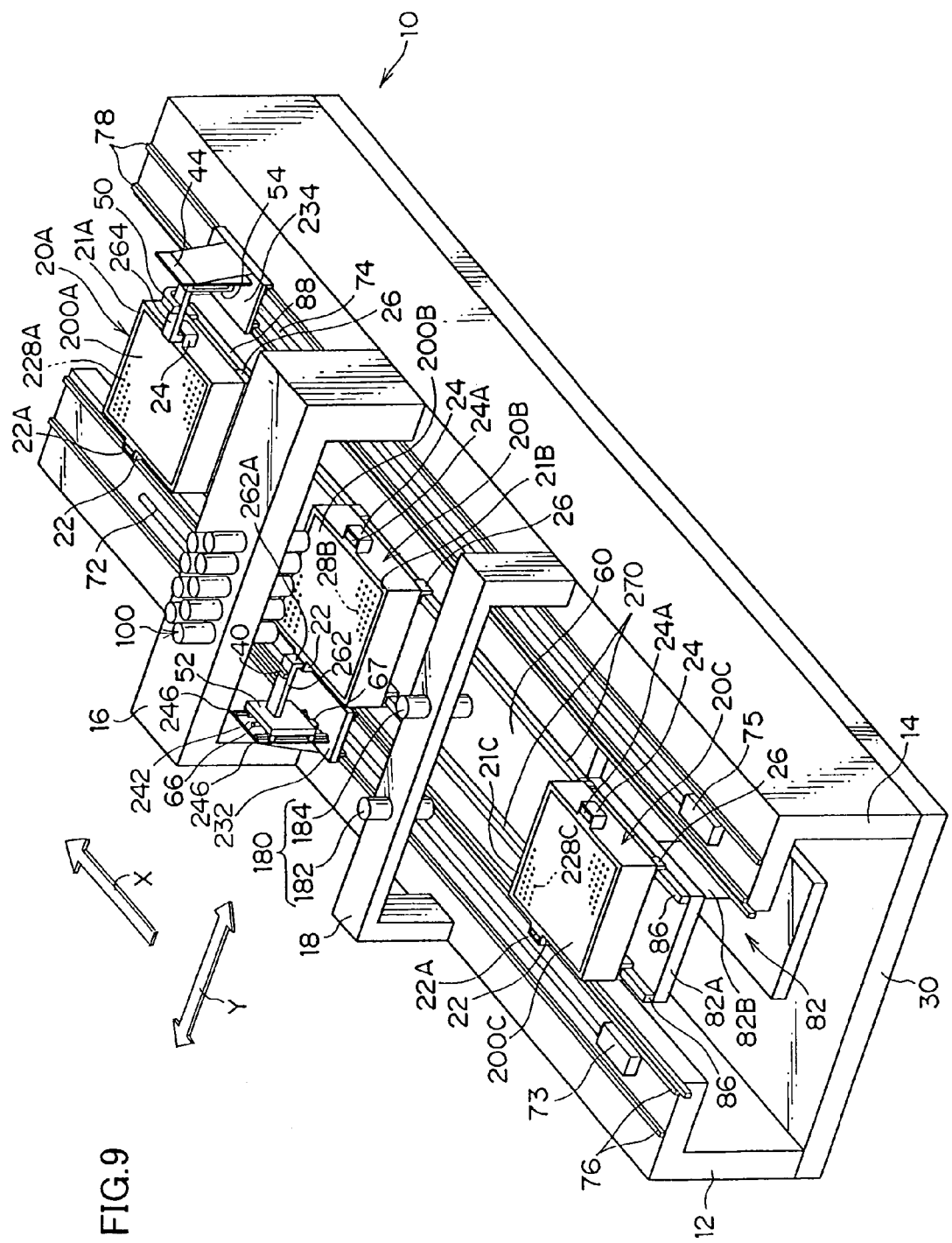
FIG. 9 is a perspective view showing the laser exposure apparatus of the second embodiment when viewed from another direction.

As shown in FIG. 9, when the exposure to the substrate material 200A on the stage member 20A is finished, the alignment marks of the substrate material 200B loaded on the stage member 20B have been already taken by the CCD cameras 182 and 184, and the process in which the position of the lithography area 204 is detected has been already finished, so that subsequently the exposure to the substrate material 200B on the stage member 20B is started. Namely, when the controller completes the exposure to the lithography area 204 of the substrate material 200A, similarly to the lithography area 204 of the substrate material 200A, the controller performs the exposure to the lithography area 204 of the next substrate material 200B on the basis of the image information after the transformation processing and the position information.

The stage member 20A in which the exposure to the substrate material 200A has been finished is further conveyed toward the conveying direction by the linear traveling body 234, and the stage member 20A changes from the upper guide rails 270 to the second changing rails 88 of the second lifting table 84A which is in the standby state at the lifted position by the second cylinder 84B. At this point, the upper guide rails 270 are integrally connected to the second changing rails 88. Namely, the end faces on the conveying direction side of the upper guide rails 270 face to the end faces on the return direction side of the second changing rails 88 without gap, so that the stage member 20A smoothly changes to the second lifting table 84A.

When the stage member 20A completely changes to the second lifting table 84A to be stopped, i.e. when the stage member 20A comes to the unloading position of the substrate material 200, the negative pressure supplied to the stage member 20A by the vacuum pump is released, and the substrate material (printed wiring board) 200A is removed from the load surface 21A of the stage member 20A by the unloader (not shown). The substrate material (printed wiring board) 200A is conveyed to the next process by the conveying device (not shown).

The stage member 20A on the second lifting table 84A, from which the substrate material 200A is removed, is lowered by the second cylinder 84B, and the joint portion 24 disengages the joint portion 264 of the linear traveling body 234. The linear traveling body 234 from which the joint portion 264 has been disengaged returns to the original position (initial position) along the guide rail 78 at a certain high speed on the sidewall 14 in such a manner that the motor 75 rotates the ball screw 74 in the direction opposite to the direction during the conveying.

Before the linear traveling body 234 is caused to return, the motor 69 is rotated to rotate the ball screw 68, and the support plate 54 is lifted to retract the joint portion 264 to the upper position. Therefore, the linear traveling body 234 can be moved without interfering with the joint portions 24 of the stage member 20B and 20C. Namely, the problem that the linear traveling body 234 moved on the sidewall 14 collides with the stage members 20B and 20C never occurs. Further, only because the cable bearer 50 is moved on the sidewall 14 to follow the linear traveling body 234 while reversed, the cable bearer 50 is not entangled.

Figure 10:
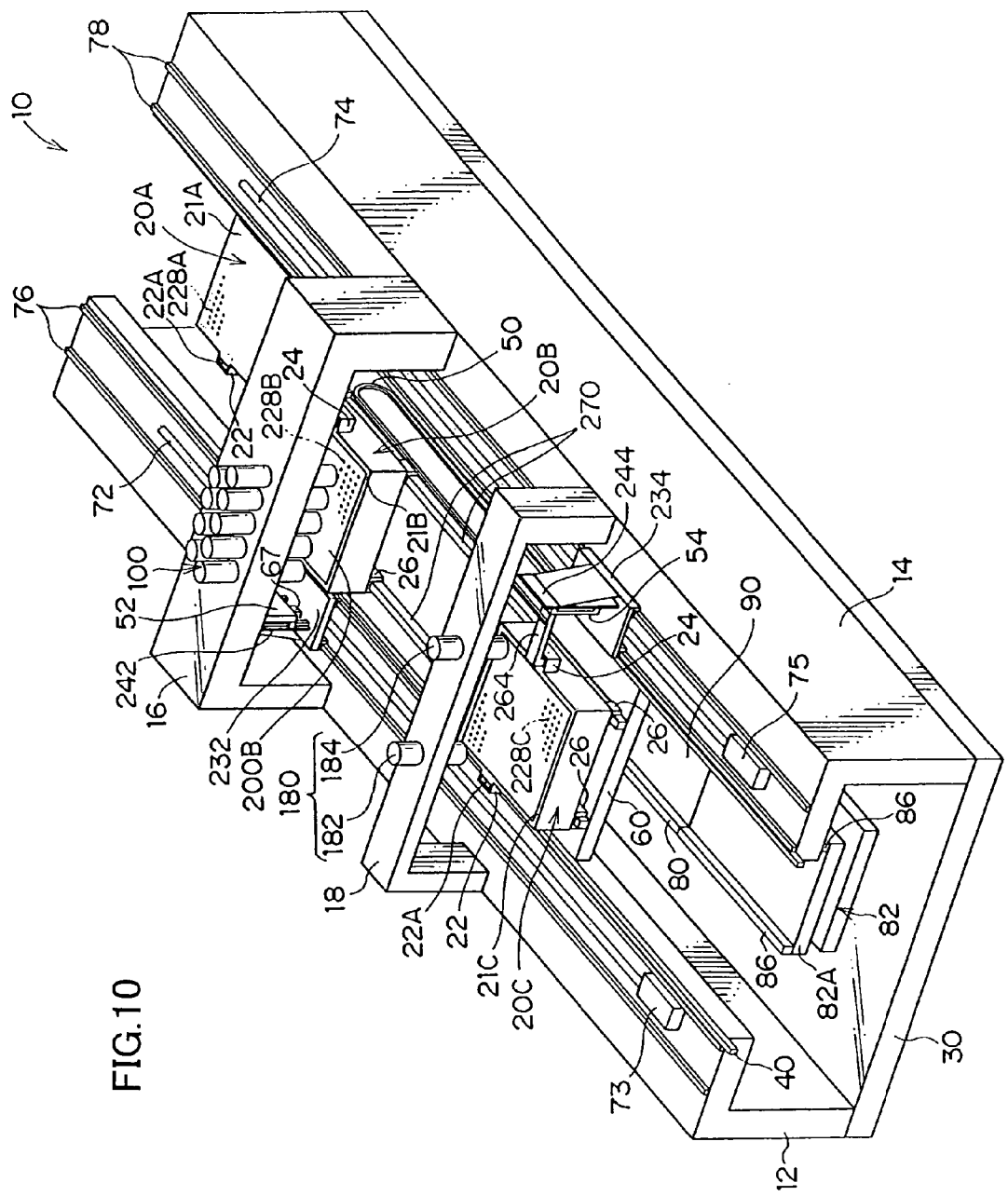
FIG. 10 is a perspective view showing the laser exposure apparatus of the second embodiment which is in a certain operating state.

When the linear traveling body 234 returns to the loading position, the support plate 54 is lowered to connect the joint portion 264 to the joint portion 24 of the stage member 20C which is in the standby state at the loading position. Similarly, the motor 75 is rotated by the drive pulse signal from the conveying control unit to rotate the ball screw 74. This allows the linear traveling body 234 to be moved toward the conveying direction along the guide rails 78. The stage member 20C is moved toward the conveying direction (from the first changing rails 86 to the upper guide rails 270) at predetermined speed, and the alignment marks of the substrate material 200C are taken by the CCD cameras 182 and 184. FIG. 10 shows this state.

In the second lifting table 84A which is lowered to the lowest portion while the stage member 20A is placed, the second changing rails 88 are integrally connected to the lower guide rails 80 on the setting stage 90. Namely, the end faces on the return direction side of the second changing rails 88 face to the end faces on the conveying direction side of the lower guide rails 80 without gap. Then, the joint portion 24 is fitted to the joint portion 92A of the linear traveling body 92 and the timing belt 94 travels, which moves the linear traveling body 92 toward the return direction. Therefore, the stage member 20A is smoothly delivered from the second changing rails 88 of the second lifting table 84A to the lower guide rails 80. When the stage member 20A is delivered to the lower guide rails 80, the second lifting table 84A is immediately lifted to be in the standby state so as to be able to receive the next stage member 20B.

The stage member 20A delivered to the lower guide rails 80 is moved toward the return direction at high speed (foe example, 1 m/s) by the linear traveling body 92. Then, similarly to the stage members 20B and 20C, the stage member 20A is moved from the lower guide rails 80 to the first changing rails 86 of the first lifting table 82A which is in the standby state at the lowered position. At this point, the lower guide rails 80 are also integrally connected to the first changing rails 86. Namely, the end faces on the return direction side of the lower guide rails 80 face to the end faces on the conveying direction side of the first changing rails 86 without gap, so that the stage member 20A smoothly changes to the first lifting table 82A.

Figure 11:
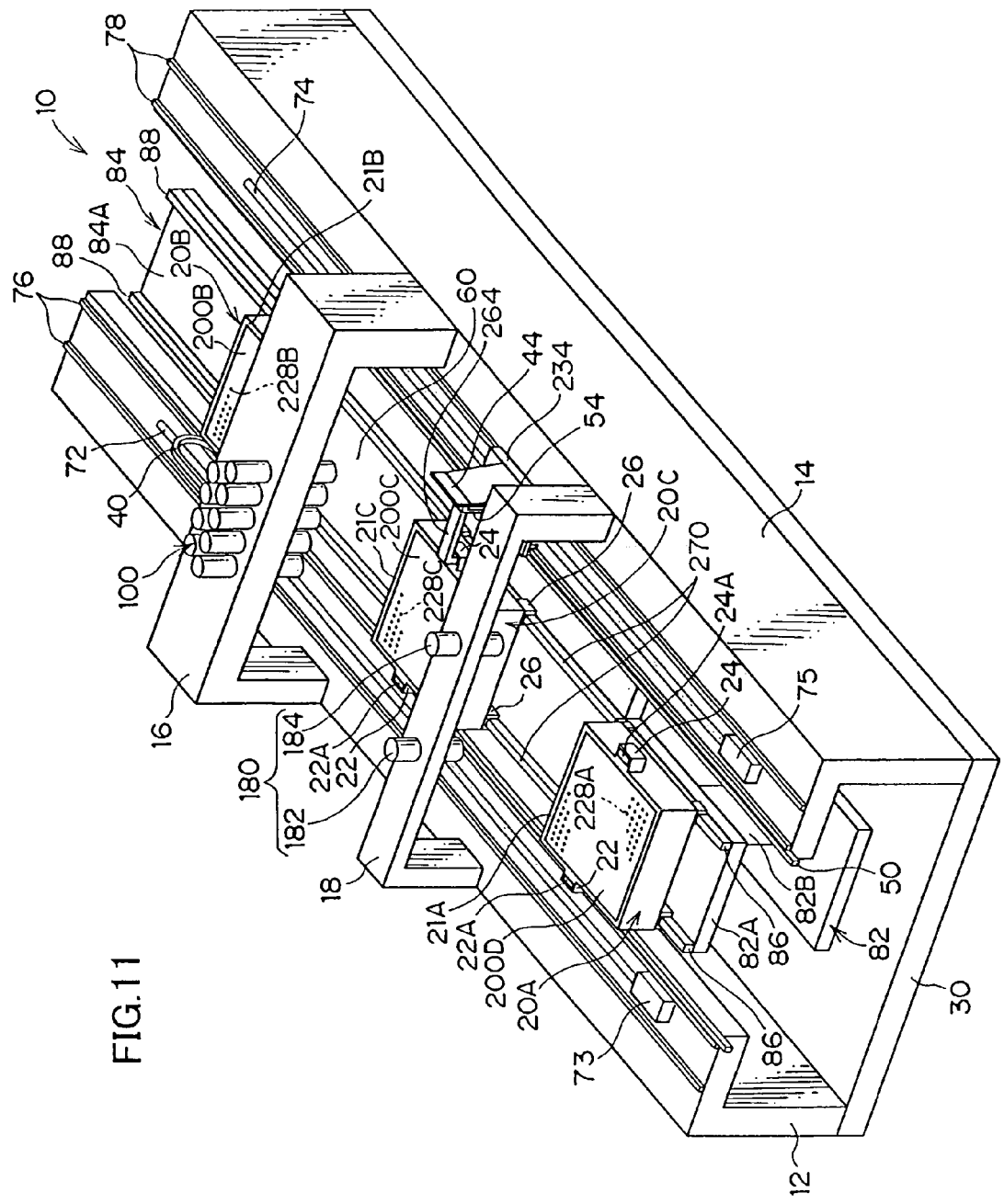
FIG. 11 is a perspective view showing the laser exposure apparatus of the second embodiment which is in another operating state.

When the stage member 20A is completely placed on the first lifting table 82A, the first lifting table 82A is lifted by the first cylinder 82B. In accordance with the lifting movement, the joint portion 24 is disconnected from the joint portion 92A of the linear traveling body 92. The next substrate material 200D is loaded on the load surface 21A of the stage member 20A at the lifted position, and the substrate material 200D is sucked and held by the negative pressure. FIG. 11 shows this state.

Figure 12:
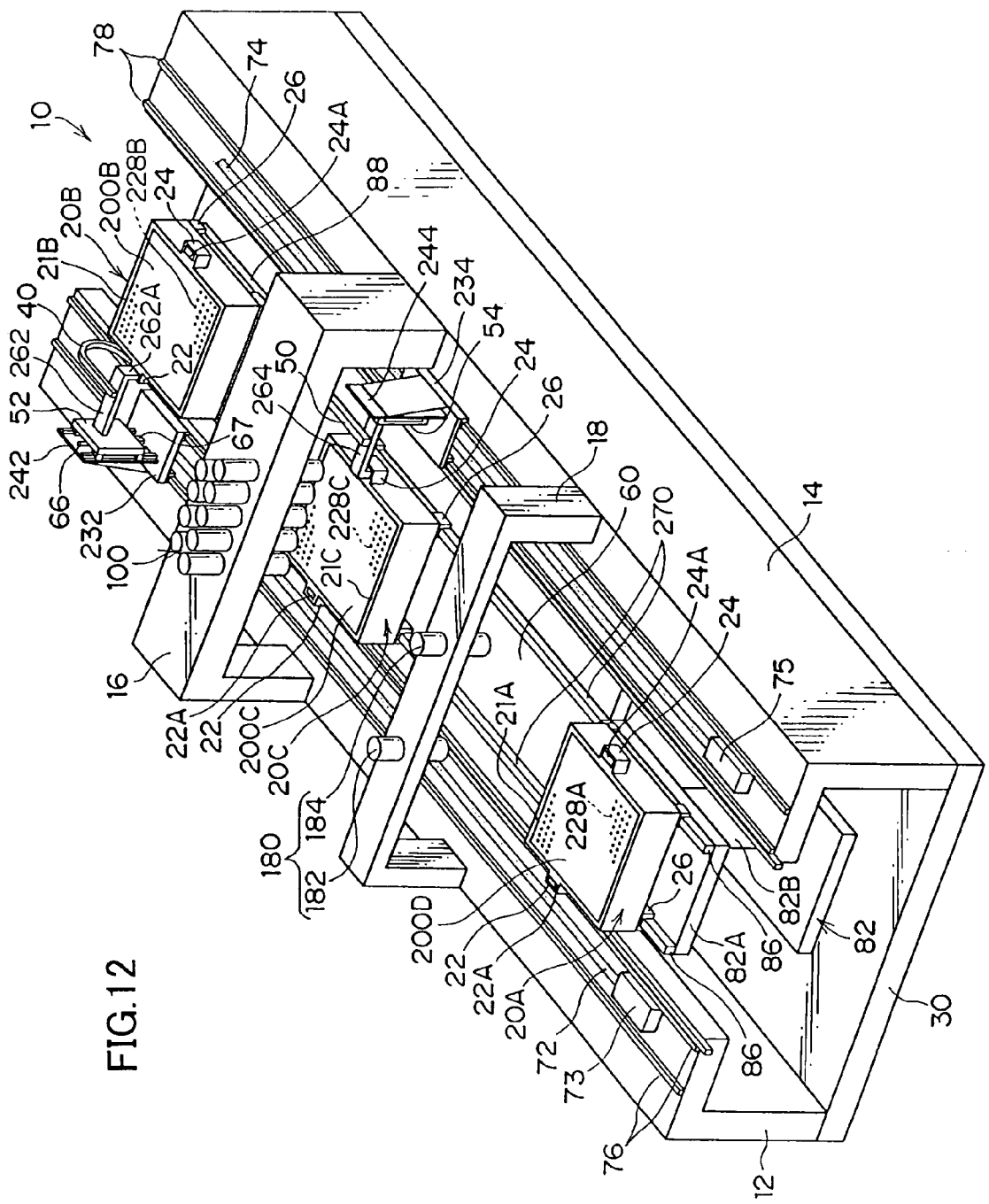
FIG. 12 is a perspective view showing the laser exposure apparatus of the second embodiment which is in still another operating state.

On the other hand, the stage member 20B in which the exposure to the substrate material 200B has been finished is further conveyed toward the conveying direction by the linear traveling body 232, and the stage member 20B changes from the upper guide rails 270 to the second changing rails 88 of the second lifting table 84A which is in the standby state at the lifted position by the second cylinder 84B. FIG. 12 shows this state. When the stage member 20B completely changes to the second lifting table 84A to be stopped, i.e. when the stage member 20A comes to the unloading position of the substrate material 200, the negative pressure supplied to the stage member 20B by the vacuum pump is released, and the substrate material (printed wiring board) 200B is removed from the load surface 21B of the stage member 20B by the unloader (not shown). The substrate material (printed wiring board) 200B is conveyed to the next process by the conveying device (not shown).

Then, when the second lifting table 84A is lowered to disconnect the joint portion 262 of the linear traveling body 232 from the joint portion 22 of the stage member 20B, the joint portion 262 is retracted to the lifted position by the support plate 52 and the linear traveling body 232 returns on the sidewall 12. Then, the joint portion 262 is connected to the joint portion of the stage member 20A which is in the standby state at the loading position, and the stage member 20A is moved toward the conveying direction at predetermined speed to repeat the above-described operations. Similarly to the stage member 20A, the stage members 20B and 20C perform the return operation, the new substrate materials are loaded on the stage members 20B and 20C respectively, and the above-described operations are repeated.

As described above, in the laser exposure apparatus 10, because each of the stage members 20A, 20B, and 20C repeatedly performs the operations, the exposure processing is substantially continuously performed. This allows the operating rate of the exposure head 100 to be improved. Therefore, the production efficiency of the printed wiring board can be improved. The number of stage members 20 is not limited to three stage members as shown in the drawings. Needless to say, the production efficiency of the printed wiring board can be further improved, when at least four stage members are provided to perform the vertically circulating movement.

The invention is not limited to the laser exposure apparatus according to the first and second embodiments. The invention can be also applied to the exposure apparatus which exposes a photosensitive printing plate such as PS plate and CT press plate and the photosensitive material such as light sensitive paper. In addition to the laser beam, visible light, X-ray, and the like can be also used as the light beam for exposing the photosensitive materials. Further, the invention can be also applied to the inkjet type image forming apparatus.

According to the invention, while the recording medium is moved, the image forming processing in which the image is formed to the recording medium can be efficiently performed. Therefore, the production efficiency of the recording medium can be improved.

The invention is not limited to the embodied structures as described above. For example, the recording medium loading position can be the same as the recording medium unloading position. In other words, loading and unloading of each of the recording mediums can be carried out at the same position.

Further, the upper side conveying means may be superior to the lower side conveying means in conveying accuracy.

What is claimed is:

1. An image forming apparatus for forming an image in a recording medium, comprising:
   a first stage and a second stage on each of which the recording medium can be mounted and which can each be moved along a predetermined circulating path; and
   a driving device which drives the second stage so that the second stage is moved independently of the movement of the first stage along the circulating path within a range in which the movement of the first stage is not obstructed, at least while the image is being formed in the recording medium on the first stage.

2. The apparatus of claim 1, wherein the circulating path includes:
   an upper path;
   a lower path;
   a first lifting path which connects an upstream side of the upper path and a downstream side of the lower path; and
   a second lifting path which connects a downstream side of the upper path and an upstream side of the lower path.

3. The apparatus of claim 2, further comprising an image forming section which is provided along the upper path and forms the image in the recording medium.

4. The apparatus of claim 2, wherein the upper path includes a loading position at which the recording medium is loaded on each stage and an unloading position at which the recording medium is unloaded from each stage.

5. The apparatus of claim 2, wherein the driving device includes:
   (i) a first driving unit which drives the first stage so that the first stage is moved along the upper path;
   (ii) a second driving unit which drives the second stage so that the second stage is moved along the upper path;
   (iii) a third driving unit which drives each stage so that each stage is moved along the lower path;
   (iv) a pair of upper guide rails which guides each stage moved along the upper path;
   (v) a pair of lower guide rails which guides each stage moved along the lower path;
   (vi) a first lift which drives each stage so that each stage is lifted along the first lifting path; and
   (vii) a second lift which drives each stage so that each stage is lowered along the second lifting path.

6. The apparatus of claim 5, wherein a distance between the upper guide rails differs from a distance between the lower guide rails.

7. The apparatus of claim 5, wherein each stage includes: a pair of first guide grooves which can engage the upper guide rails; and a pair of second guide grooves which can engage the lower guide rails.

8. The apparatus of claim 7, wherein
   the first lift includes a first lifting table which can support each stage and a first lifting member which can lift and lower the first lifting table,
   the first lifting table includes a pair of rails which can engage the second guide grooves,
   the second lift includes a second lifting table which can support each stage and a second lifting member which can lift and lower the second lifting table, and
   the second lifting table includes a pair of rails which can engage the second guide grooves.

9. The apparatus of claim 5, wherein the first driving unit includes a linear traveling body to which the first stage is detachably connected and which moves with the first stage, and the second driving unit includes a linear traveling body to which the second stage is detachably connected and which moves with the second stage.

10. An image forming apparatus for forming an image in a recording medium, comprising:
    at least three stages on each of which the recording medium can be mounted and which can each be moved along a predetermined circulating path; and
    a driving device which, at least while the image is being formed in the recording medium on one stage, drives remaining stages so that the remaining stages are moved independently of the movement of the one stage along the circulating path within a range in which the movement of the one stage is not obstructed.

11. The apparatus of claim 10, wherein the circulating path includes:
    an upper path;
    a lower path;
    a first lifting path which connects an upstream side of the upper path and a downstream side of the lower path; and
    a second lifting path which connects a downstream side of the upper path and an upstream side of the lower path.

12. The apparatus of claim 11, further comprising:
a position information obtaining section which is provided on the upstream side along the upper path and obtains position information concerning the recording medium; and
an image forming section which is provided on the downstream side along the upper path and forms the image in the recording medium.

13. The apparatus of claim 11, wherein the upper path includes:
a loading position at which the recording medium is loaded on each stage; and
an unloading position at which the recording medium is unloaded from each stage.

14. The apparatus of claim 11, wherein the driving device includes:
(i) a first driving unit which drives one stage so that the one stage is moved along the upper path;
(ii) a second driving unit which drives another one stage so that the another stage following the first stage is moved along the upper path;
(iii) a third driving unit which drives each stage so that each stage is moved along the lower path,
(iv) a pair of upper guide rails which guides each stage moved along the upper path,
(v) a pair of lower guide rails which guides each stage moved along the lower path,
(vi) a first lift which drives each stage so that each stage is lifted along the first lifting path, and
(vii) a second lift which drives each stage so that each stage is lowered along the second lifting path.

15. The apparatus of claim 14, wherein a distance between the upper guide rails is substantially the same as a distance between the lower guide rails.

16. The apparatus of claim 14, wherein each stage includes a pair of guide grooves which can engage the upper guide rails and the lower guide rails.

17. The apparatus of claim 16, wherein
the first lift includes a first lifting table which can support each stage and a first lifting member which can lift and lower the first lifting table,
the first lifting table includes a pair of rails which can engage the guide grooves on each stage,
the second lift includes a second lifting table which can support each stage and a second lifting member which can lift and lower the second lifting table, and
the second lifting table includes a pair of rails which can engage the guide grooves on each stage.

18. The apparatus of claim 14, wherein
the first driving unit includes a linear traveling body to which one stage is detachably connected and which moves with the one stage,
the second driving unit includes a linear traveling body to which another stage following the one stage is detachably connected and which moves with the another stage, and
the third driving unit includes a linear traveling body to which each stage is detachably connected and which moves with each stage.

19. The apparatus of claim 18, wherein the linear traveling body of the first driving unit and the linear traveling body of the second driving unit provide negative pressure for sucking the recording medium to the corresponding stage when the linear traveling body of the first driving unit and the linear traveling body of the second driving unit connect to the corresponding stage.

20. The apparatus of claim 14, wherein the upper guide rails include a vibration isolator.

21. An image forming apparatus for forming an image in a recording medium, comprising:
a plurality of stage members on each of which the recording medium can be mounted; and
a circulating mechanism which circularly conveys the stage members in order of a loading position of the recording medium, a position where the image is formed in the recording medium, and an unloading position of the recording medium, the circulating mechanism conveying the stage members so that one stage member and another stage member pass above and below each other.

22. The apparatus of claim 21, wherein the plurality of stage members is conveyed along the same path.

23. The apparatus of claim 21, wherein the circulating mechanism includes two horizontal conveying paths which are arranged above and below each other and two vertical conveying paths which move the stage member between end portions of each of the two horizontal conveying paths.

24. The apparatus of claim 23, wherein the circulating mechanism further includes two conveying units which convey the stage members along the two horizontal conveying paths respectively, wherein one of the two horizontal conveying paths includes the image forming position, and wherein a conveying unit for the one of the two horizontal conveying paths has higher conveying accuracy compared with a conveying unit for the other horizontal conveying path.

25. The apparatus of claim 23, wherein the circulating mechanism further includes two conveying units which convey the stage members along the two horizontal conveying paths respectively, wherein one of the two horizontal conveying paths includes the image forming position, and wherein a conveying unit for the one of the two horizontal conveying paths has a lower conveying speed compared with a conveying unit for the other horizontal conveying path.

26. The apparatus of claim 23, wherein one of the two horizontal conveying paths includes the image forming position and a position detection position for detecting the position of the recording medium.

* * * * *